US012100729B2

(12) United States Patent
Garner et al.

(10) Patent No.: US 12,100,729 B2
(45) Date of Patent: Sep. 24, 2024

(54) APPARATUS AND METHODS FOR ASSEMBLING A DISPLAY AREA

(71) Applicant: CORNING INCORPORATED, Corning, NY (US)

(72) Inventors: Sean Matthew Garner, Elmira, NY (US); David Robert Heine, Seminole, FL (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 18/522,502

(22) Filed: Nov. 29, 2023

(65) Prior Publication Data

US 2024/0136390 A1 Apr. 25, 2024

Related U.S. Application Data

(62) Division of application No. 17/750,852, filed on May 23, 2022, now Pat. No. 11,881,501, which is a (Continued)

(51) Int. Cl.
*H01L 27/15* (2006.01)
*H01L 33/62* (2010.01)

(52) U.S. Cl.
CPC ............ *H01L 27/156* (2013.01); *H01L 33/62* (2013.01); *H01L 2933/0066* (2013.01)

(58) Field of Classification Search
CPC .................. H01L 27/156; H01L 33/62; H01L 2933/0066; H01L 25/075; H01L 25/0753; H01L 33/005; H01L 33/48
See application file for complete search history.

(56) References Cited

U.S. PATENT DOCUMENTS 5,198,054 A 3/1993 Drake et al.
5,889,568 A 3/1999 Seraphim et al.
(Continued)

FOREIGN PATENT DOCUMENTS

CN 101673009 A 3/2010
CN 102543003 A 7/2012
(Continued)

OTHER PUBLICATIONS

Aston, Mark, "Design of Large-area OLED Displays Utilizing Seamless Tiled Components", Journal of the SID vol. 15, No. 8, 2007, pp. 535-540.
(Continued)

*Primary Examiner* — Victor A Mandala
(74) *Attorney, Agent, or Firm* — Kevin M. Able

(57) ABSTRACT

A method of assembling a display area includes selecting a first tile from a plurality of tiles, each tile of the plurality of tiles includes a predetermined parameter and a plurality of microLEDs defining a plurality of pixels. The selecting the first tile based on a value of the predetermined parameter of the first tile. The method includes selecting a second tile from the plurality of tiles based on a value of the predetermined parameter of the second tile. The method further includes positioning the first tile and the second tile into an array defining at least a portion of the display area. A first edge of the first tile facing a second edge of the second tile. A display device including the display area assembled by the method is also provided.

15 Claims, 6 Drawing Sheets

Related U.S. Application Data division of application No. 16/761,085, filed as application No. PCT/US2018/059300 on Nov. 6, 2018, now Pat. No. 11,374,053.

(60) Provisional application No. 62/583,020, filed on Nov. 8, 2017.

(56) References Cited

U.S. PATENT DOCUMENTS

| | | | |
|---|---|---|---|
| 5,903,328 | A | 5/1999 | Greene et al. |
| 6,262,696 | B1 | 7/2001 | Seraphim et al. |
| 6,509,941 | B2 | 1/2003 | Freidhoff et al. |
| 6,642,542 | B1 | 11/2003 | Shimoda et al. |
| 6,853,411 | B2 | 2/2005 | Freidhoff et al. |
| 6,967,114 | B2 | 11/2005 | Shimoda et al. |
| 7,282,385 | B2 | 10/2007 | Gyoda et al. |
| 7,834,537 | B2 | 11/2010 | Kee et al. |
| 8,063,400 | B2 | 11/2011 | Sugimoto |
| 8,223,087 | B2 | 7/2012 | Lee et al. |
| 8,941,555 | B2 | 1/2015 | Yoo |
| 9,240,438 | B2 | 1/2016 | Iijima et al. |
| 9,480,151 | B2 | 10/2016 | De Kok et al. |
| 9,590,025 | B2 | 3/2017 | Yu et al. |
| 10,483,253 | B1* | 11/2019 | Hu .......................... H01L 25/50 |
| 11,777,067 | B2* | 10/2023 | Feng ....................... H01L 33/62 |
| | | | 257/89 |
| 2002/0130987 | A1* | 9/2002 | Rajeswaran ........... H10K 59/18 |
| | | | 349/73 |
| 2002/0173215 | A1 | 11/2002 | Freidhoff et al. |
| 2004/0212633 | A1* | 10/2004 | Natori ................. G09G 3/2003 |
| | | | 345/694 |
| 2005/0078104 | A1* | 4/2005 | Matthies ............ G02F 1/13336 |
| | | | 345/204 |
| 2005/0140569 | A1 | 6/2005 | Sundahl |
| 2005/0185114 | A1 | 8/2005 | Cok |
| 2009/0310065 | A1* | 12/2009 | Dunn ..................... H05K 13/00 |
| | | | 349/69 |
| 2011/0221995 | A1 | 9/2011 | Park |
| 2012/0154462 | A1 | 6/2012 | Hempson et al. |
| 2013/0342741 | A1 | 12/2013 | Liu et al. |
| 2015/0091787 | A1* | 4/2015 | Ohmae ................ G09G 3/2003 |
| | | | 345/83 |
| 2015/0371585 | A1 | 12/2015 | Bower et al. |
| 2015/0379182 | A1 | 12/2015 | Kunst et al. |
| 2016/0365026 | A1 | 12/2016 | Bower et al. |
| 2016/0371047 | A1* | 12/2016 | Cope ...................... C23C 14/562 |
| 2017/0012026 | A1* | 1/2017 | Choi ........................ H01L 33/62 |
| 2017/0025593 | A1* | 1/2017 | Bower ................... H10K 59/18 |
| 2017/0047393 | A1* | 2/2017 | Bower ..................... H01L 33/62 |
| 2017/0077436 | A1* | 3/2017 | Yue .......................... G06F 3/1446 |
| 2017/0103926 | A1* | 4/2017 | Aoyagi .................... H01L 22/22 |
| 2017/0213502 | A1* | 7/2017 | Henry ...................... H01L 33/62 |
| 2017/0309698 | A1* | 10/2017 | Bower ................. H10K 59/131 |
| 2018/0006011 | A1* | 1/2018 | Ninan .................. H01L 27/0207 |
| 2018/0017993 | A1* | 1/2018 | Brooks ............... H01L 25/0753 |
| 2018/0120639 | A1* | 5/2018 | Shih .................. G02F 1/133603 |
| 2019/0043940 | A1* | 2/2019 | Lee ......................... H01L 27/156 |
| 2019/0114961 | A1* | 4/2019 | Chang ....................... G09G 3/20 |
| 2020/0163233 | A1* | 5/2020 | Brackley ............... G09F 9/3026 |
| 2020/0243738 | A1* | 7/2020 | Feng ...................... G02F 1/13336 |
| 2020/0295225 | A1* | 9/2020 | Hsieh .................. H01L 25/0753 |
| 2021/0280817 | A1* | 9/2021 | Logunov ................. H10K 71/421 |
| 2022/0035203 | A1* | 2/2022 | Shih .................. G02F 1/133504 |
| 2023/0306931 | A1* | 9/2023 | Iversen .................. G06F 3/1446 |

FOREIGN PATENT DOCUMENTS

| | | |
|---|---|---|
| CN | 102832230 A | 12/2012 |
| CN | 103517004 A | 1/2014 |
| JP | 05-229124 A | 9/1993 |
| JP | 2003-140572 A | 5/2003 |
| JP | 2008-281662 A | 11/2008 |
| JP | 2014-026120 A | 2/2014 |
| JP | 2017-125952 A | 7/2017 |
| KR | 10-1018784 B1 | 3/2011 |
| KR | 10-2011-0093330 A | 8/2011 |
| KR | 10-1157425 B1 | 6/2012 |

OTHER PUBLICATIONS

Chinese Patent Application No. 201880080784.X, Office Action, dated May 30, 2023, 6 pages, Chinese Patent Office.

International Preliminary Report On Patentability of the International Searching Authority; PCT/US2018/059300; Mailed May 22, 2020; 7 Pages; Korean Intellectual Property Office.

International Search Report and Written Opinion of the International Searching Authority; PCT/US18/059300; Mailed Feb. 25, 2019; 9 Pages; Korean Intellectual Property Office.

Japanese Patent Application No. 2020-525853, Notice of Reasons for Refusal dated Nov. 2, 2022, 12 pages (6 pages of English Translation and 6 pages of Original Document), Japanese Patent Office.

* cited by examiner

APPARATUS AND METHODS FOR ASSEMBLING A DISPLAY AREA

CROSS REFERENCE TO RELATED APPLICATIONS

This is a divisional application and claims the benefit of priority under 35 U.S.C. § 120 of U.S. application Ser. No. 17/750,852 filed on May 23, 2022, which in turn claims the benefit of priority of U.S. application Ser. No. 16/761,085, filed on May 1, 2020, which in turn claims the benefit of priority under 35 U.S.C. § 371 of International Application Serial No.: PCT/US2018/059300 filed on Nov. 6, 2018, which, in turn, claims the benefit of priority under 35 U.S.C. § 119 of U.S. Provisional Application Ser. No. 62/583,020 filed on Nov. 8, 2017, the contents of each of which are relied upon and incorporated herein by reference in their entireties.

FIELD

The present disclosure relates generally to methods and apparatus for assembling a display area of a display device and, more particularly, to methods and apparatus for positioning a plurality of tiles into an array defining at least a portion of the display area.

BACKGROUND

It is known to position a plurality of tiles into an array defining at least a portion of a display area of a display device.

SUMMARY

The following presents a simplified summary of the disclosure to provide a basic understanding of some embodiments described in the detailed description.

In some embodiments, a method of assembling a display area can include selecting a first tile from a plurality of tiles. Each tile of the plurality of tiles can include a predetermined parameter and a plurality of microLEDs defining a plurality of pixels. The selecting the first tile can be based on a value of the predetermined parameter of the first tile. The method can include selecting a second tile from the plurality of tiles based on a value of the predetermined parameter of the second tile. The method can include positioning the first tile and the second tile into an array defining at least a portion of the display area. A first edge of the first tile can face a second edge of the second tile.

In some embodiments, the value of the predetermined parameter of the first tile can be greater than a nominal value of the predetermined parameter, and the value of the predetermined parameter of the second tile can be less than the nominal value of the predetermined parameter.

In some embodiments, the value of the predetermined parameter of the first tile can define a greatest value of the predetermined parameters of the plurality of tiles relative to a nominal value of the predetermined parameter, and the value of the predetermined parameter of the second tile can define a smallest value of the predetermined parameters of the plurality of tiles relative to the nominal value of the predetermined parameter.

In some embodiments, the method can further include sorting the plurality of tiles based on a respective value of the predetermined parameter of the plurality of tiles.

In some embodiments, the sorting can include identifying a first set of tiles and a second set of tiles. The respective value of the predetermined parameter of each tile of the first set of tiles can be greater than a nominal value of the predetermined parameter, and the respective value of the predetermined parameter of each tile of the second set of tiles can be less than the nominal value of the predetermined parameter.

In some embodiments, the method can further include ordering the first set of tiles in ascending order or descending order based on the respective value of the predetermined parameter of each tile of the first set of tiles, and ordering the second set of tiles in ascending order or descending order based on the respective value of the predetermined parameter of each tile of the second set of tiles.

In some embodiments, the first tile can be selected from the first set of tiles and the second tile can be selected from the second set of tiles.

In some embodiments, the value of the predetermined parameter of the first tile can define a greatest value of the predetermined parameters of the first set of tiles relative to the nominal value of the predetermined parameter, and the value of the predetermined parameter of the second tile can define a smallest value of the predetermined parameters of the second set of tiles relative to the nominal value of the predetermined parameter.

In some embodiments, the method can further include selecting at least one additional tile from the plurality of tiles based on a value of the predetermined parameter of the at least one additional tile and positioning the at least one additional tile into the array.

In some embodiments, the predetermined parameter of each tile of the plurality of tiles can include at least one of a respective lateral dimension of each tile of the plurality of tiles, a respective edge straightness of each tile of the plurality of tiles, and a respective squareness of each tile of the plurality of tiles.

In some embodiments, a display device can include the display area assembled by the method, and a lateral distance between immediately adjacent pixels of the plurality of pixels can define a pixel pitch. A lateral distance between at least one first outer pixel of the first tile spaced from the first edge of the first tile and at least one second outer pixel of the second tile spaced from the second edge of the second tile can define a registration pitch, and the registration pitch can be less than or equal to about 1.5 times the pixel pitch.

In some embodiments, the registration pitch can be less than or equal to about 1.1 times the pixel pitch.

In some embodiments, the registration pitch can be less than or equal to about 1.01 times the pixel pitch.

In some embodiments, the pixel pitch can be from about 100 micrometers to about 500 micrometers.

In some embodiments, a method of assembling a display area can include selecting a plurality of pairs of tiles from a plurality of tiles. Each tile of the plurality of tiles can include a predetermined parameter and a plurality of microLEDs defining a plurality of pixels. The selecting the plurality of pairs of tiles can be based on a respective value of the predetermined parameter of each tile of the plurality of tiles. Each pair of tiles can include a first tile and a second tile, the respective value of the predetermined parameter of the first tile of each pair of tiles can be greater than the respective value of the predetermined parameter of the second tile of each pair of tiles. The method can further include positioning the plurality of pairs of tiles into an array defining at least a portion of the display area. A respective first edge of the first tile of each pair of tiles can face a respective second edge of the second tile of each pair of tiles.

In some embodiments, the respective value of the predetermined parameter of the first tile of each pair of tiles can be greater than a nominal value of the predetermined parameter, and the respective value of the predetermined parameter of the second tile of each pair of tiles can be less than the nominal value of the predetermined parameter.

In some embodiments, the method can further include identifying a first set of tiles from the plurality of tiles and identifying a second set of tiles from the plurality of tiles. The respective value of the predetermined parameter of each tile of the first set of tiles can be greater than a nominal value of the predetermined parameter and the respective value of the predetermined parameter of each tile of the second set of tiles can be less than the nominal value of the predetermined parameter. The first tile of each pair of tiles can be selected from the first set of tiles, and the second tile of each pair of tiles can be selected from the second set of tiles.

In some embodiments, the method can further include ordering the first set of tiles in ascending order or descending order based on the respective value of the predetermined parameter of each tile of the first set of tiles, and ordering the second set of tiles in ascending order or descending order based on the respective value of the predetermined parameter of each tile of the second set of tiles. The first tile of each pair of tiles can be sequentially selected from the first set of ordered tiles and the second tile of each pair of tiles can be sequentially selected from the second set of ordered tiles.

In some embodiments, the predetermined parameter of each tile of the plurality of tiles can include at least one of a respective lateral dimension of each tile of the plurality of tiles, a respective edge straightness of each tile of the plurality of tiles, and a respective squareness of each tile of the plurality of tiles.

In some embodiments, a display device can include the display area assembled by the method, and a lateral distance between immediately adjacent pixels of the plurality of pixels can define a pixel pitch from about 100 micrometers to about 500 micrometers.

BRIEF DESCRIPTION OF THE DRAWINGS

These and other features, embodiments and advantages are better understood when the following detailed description is read with reference to the accompanying drawings, in which.

DETAILED DESCRIPTION

Figure 1:
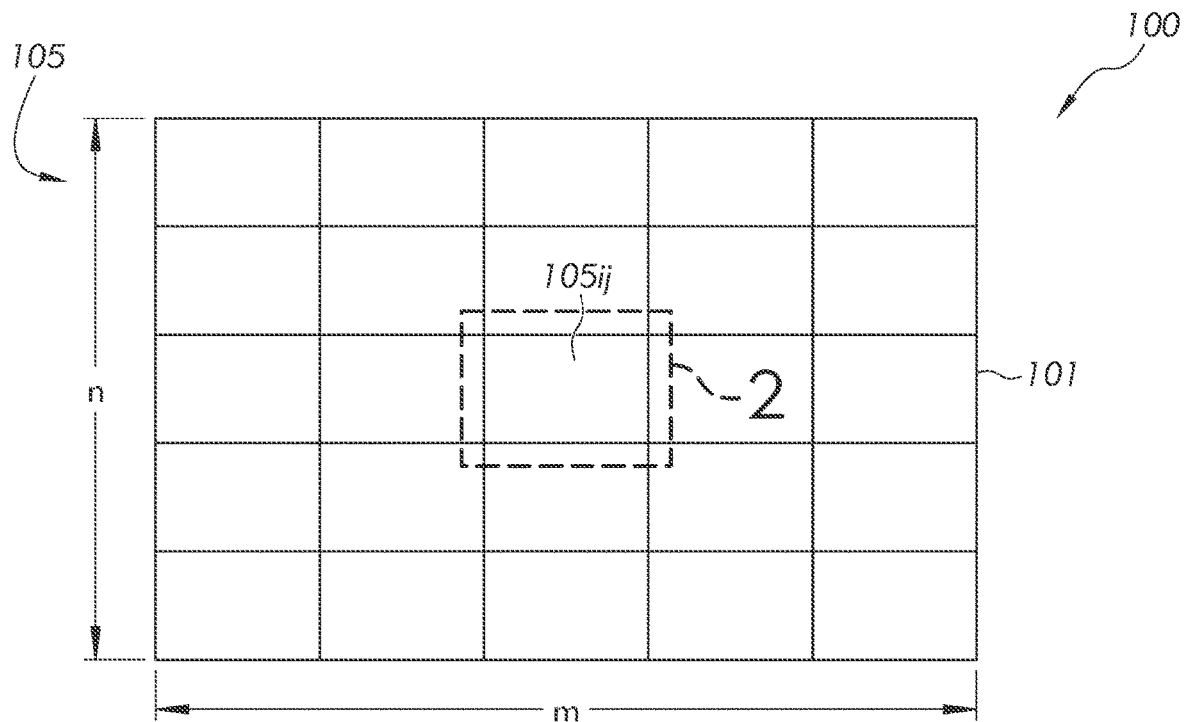
FIG. 1 illustrates a schematic view of an exemplary embodiment of a display device including a display area including a plurality of tiles in accordance with embodiments of the disclosure.

Embodiments will now be described more fully hereinafter with reference to the accompanying drawings in which example embodiments are shown. Whenever possible, the same reference numerals are used throughout the drawings to refer to the same or like parts. However, this disclosure may be embodied in many different forms and should not be construed as limited to the embodiments set forth herein.

It is to be understood that specific embodiments disclosed herein are intended to be exemplary and therefore non-limiting. For purposes of the disclosure, FIG. 1 illustrates a schematic view of an exemplary display device 100 including a plurality of tiles 105. In some embodiments, the plurality of tiles 105 can be positioned into an array (e.g. an n×m array) defining a display area 101 of the display device 100. In some embodiments, the display device 100 can be employed in one or more applications including, but not limited to, mobile devices, wearables (e.g., watches), televisions, automotive displays, transparent displays, signage, computers, tablets, and other display monitors where a user may view and/or interact with (e.g., touch, contact) the display area 101 of the display device 100. Additionally, in some embodiments, the display device 100 can be employed in a direct-view display (e.g., MicroLED display). Moreover, in some embodiments. the display device 100 can be integrated into a display (e.g., LCD display) and employed as a backlight unit.

Additionally, although illustrated as a planar, rectangular display area 101 including a 5×5 (n×m) array, in some embodiments, the display area 101 can include a variety of shapes, sizes, and planarity including, but not limited to circular, elliptical, and other geometric and polygonal shapes, in any number of n×m arrays, defining a planar or non-planar display area 101, without departing from the scope of the disclosure. In some embodiments, the display area 101 can include symmetric or asymmetric, as well as regular or irregular shapes achieved by one or more tiling methods in accordance with embodiments of the disclosure. Likewise, although illustrated as planar, rectangular tiles, in some embodiments, one or more tiles of the plurality of tiles 105 can include a variety of shapes, sizes, and planarity including, but not limited to triangular, and other geometric and polygonal shapes, in any size (e.g., dimension) including symmetric or asymmetric tiles, as well as regular or irregular shapes defining a planar or non-planar tile, without departing from the scope of the disclosure.

In some embodiments, by assembling the display area 101 with the plurality of tiles 105, in the event one or more tiles of the plurality of tiles 105 is determined to be defective (e.g., faulty electrical wiring, broken, malfunctioning), the one or more defective tiles can be removed from the n×m array and at least one of repaired and replaced. Alternatively, if the display area 101 was provided as a single, relatively larger tile as compared to a plurality of relatively smaller tiles, in the event the single, relatively larger tile was determined to be defective, the entire display would be defective. Thus, in some embodiments, by providing the display area 101 as a plurality of tiles 105 assembled into an n×m array, costs, time, and waste associated with providing the display area 101 of the display device 100 can be reduced and assembly of the display area 101 can be performed more efficiently.

Figure 2:
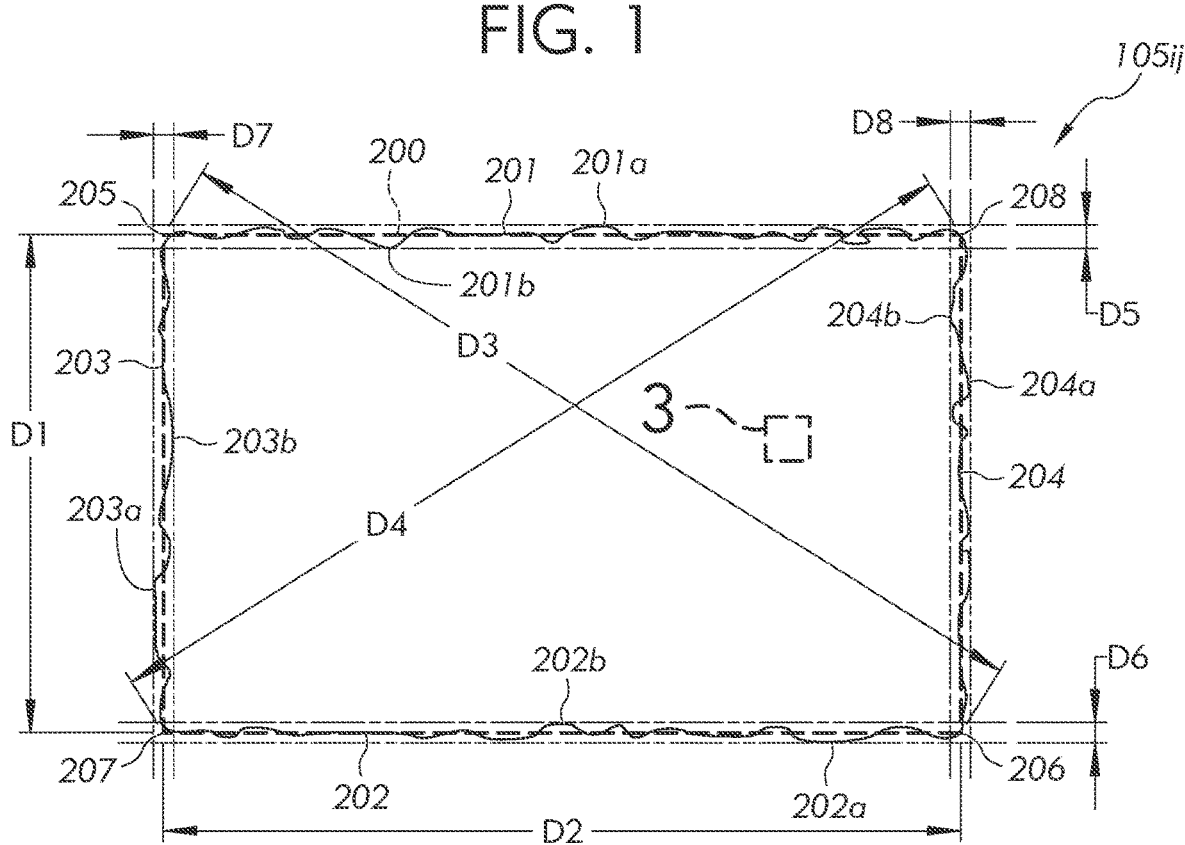
FIG. 2 illustrates an enlarged view of a tile of the plurality of tiles of the display area as shown by view 2 of FIG. 1 in accordance with embodiments of the disclosure.

FIG. 2 illustrates an enlarged view of a tile 105ij of the plurality of tiles 105 as shown by view 2 of FIG. 1, where the tile 105ij can be representative of one or more individual tiles of the plurality of tiles 105 positioned into the (n×m) array defining the display area 101 of the display device 100. A nominal tile 200, shown in a dashed outline, can be representative of a nominal (e.g., desired, intended) profile of the tile 105ij. Additionally, as illustrated in FIG. 2 and as discussed more fully below, in some embodiments, features of the tile 105ij may deviate from features of the nominal tile 200 based at least on the technique employed to cut the tile 105ij including accuracy, precision, and tolerances of the cutting technique. If the cutting technique could reliably provide each tile of the plurality of tiles 105 with the features of the nominal tile 200, positioning of the plurality of tiles 105 into the n×m array could be accomplished without consideration of deviations from the nominal features. However, because at least the technique employed to cut the tile 105ij including accuracy, precision, and tolerances of the cutting technique can, in some embodiments, provide features of the tile 105ij that deviate from features of the nominal tile 200, such deviations may be considered, in some embodiments, when assembling the plurality of tiles 105 into the n×m array.

For example, in some embodiments, the tile 105ij can include a predetermined parameter including at least one of a respective lateral dimension of the tile 105ij, a respective edge straightness of the tile 105ij, and a respective squareness of the tile 105ij. In some embodiments, the predetermined parameter can be based on one or more of a direct measurement of a feature of the tile 105ij, a numerical distribution of the predetermined parameter of the tile 105ij, and a numerical distribution of predetermined parameters of statistically similar tiles. Additionally, in some embodiments, the predetermined parameter can be based on a predetermined range relative to a nominal value, where, for example, one or more tiles including a predetermined parameter within 6-sigma or 3-sigma of the nominal value can be selected.

In some embodiments, a value of the predetermined parameter of the tile 105ij can include a first lateral dimension D1 (e.g., an average lateral dimension) between a first edge 201 of the tile 105ij and an opposing second edge 202 of the tile 105ij. Likewise, in some embodiments, a value of the predetermined parameter of the tile 105ij can include a second lateral dimension D2 (e.g., an average lateral dimension) between a third edge 203 of the tile 105ij and an opposing fourth edge 204 of the tile 105ij. In some embodiments, a value of the predetermined parameter of the tile 105ij can include a first straightness D5 of the first edge 201 of the tile 105ij defined between a maximum location 201a of the first edge 201 relative to the first lateral dimension D1 and a minimum location 201b of the first edge 201 relative to the first lateral dimension D1. In some embodiments, a value of the predetermined parameter of the tile 105ij can include a second straightness D6 of the second edge 202 of the tile 105ij defined between a maximum location 202a of the second edge 202 relative to the first lateral dimension D1 and a minimum location 202b of the second edge 202 relative to the first lateral dimension D1. In some embodiments, a value of the predetermined parameter of the tile 105ij can include a third straightness D7 of the third edge 203 of the tile 105ij defined between a maximum location 203a of the third edge 203 relative to the second lateral dimension D2 and a minimum location 203b of the third edge 203 relative to the second lateral dimension D2. Likewise, in some embodiments, a value of the predetermined parameter of the tile 105ij can include a fourth straightness D8 of the fourth edge 204 of the tile 105ij defined between a maximum location 204a of the fourth edge 204 relative to the second lateral dimension D2 and a minimum location 204b of the fourth edge 204 relative to the second lateral dimension D2.

Additionally, in some embodiments, a value of the predetermined parameter of the tile 105ij can include a squareness of the tile 105ij defined as a difference between a first diagonal dimension D3 of the tile 105ij and a second diagonal dimension D4 of the tile 105ij. In some embodiments, the first diagonal dimension D3 can be defined as a distance between a first corner 205 of the tile 105ij located at an intersection of the first edge 201 and the third edge 203 and a second corner 206 of the tile 105ij located at an intersection of the second edge 202 and the fourth edge 204. Likewise, in some embodiments, the second diagonal dimension D4 can be defined as a distance between a third corner 207 of the tile 105ij located at an intersection of the second edge 202 and the third edge 203 and a fourth corner 208 of the tile 105ij located at an intersection of the first edge 201 and the fourth edge 204. In some embodiments, the squareness parameter can be defined as a measure of how one or more corners of the tile 105ij compare to one or more respective corners of the nominal tile 200. For example, in some embodiments, one or more corners of the nominal tile 200 can include an angle of 90 degrees (e.g., rectangular), and the squareness parameter can compare how the respective angle of one or more corners of the tile 105ij compares to the angle of 90 degrees. Additionally, in some embodiments, one or more corners of the nominal tile 200 can include a non 90 degree angle, and the squareness parameter can compare how the respective angle of one or more corners of the tile 105ij compares to the non 90 degree angle.

Figure 3:
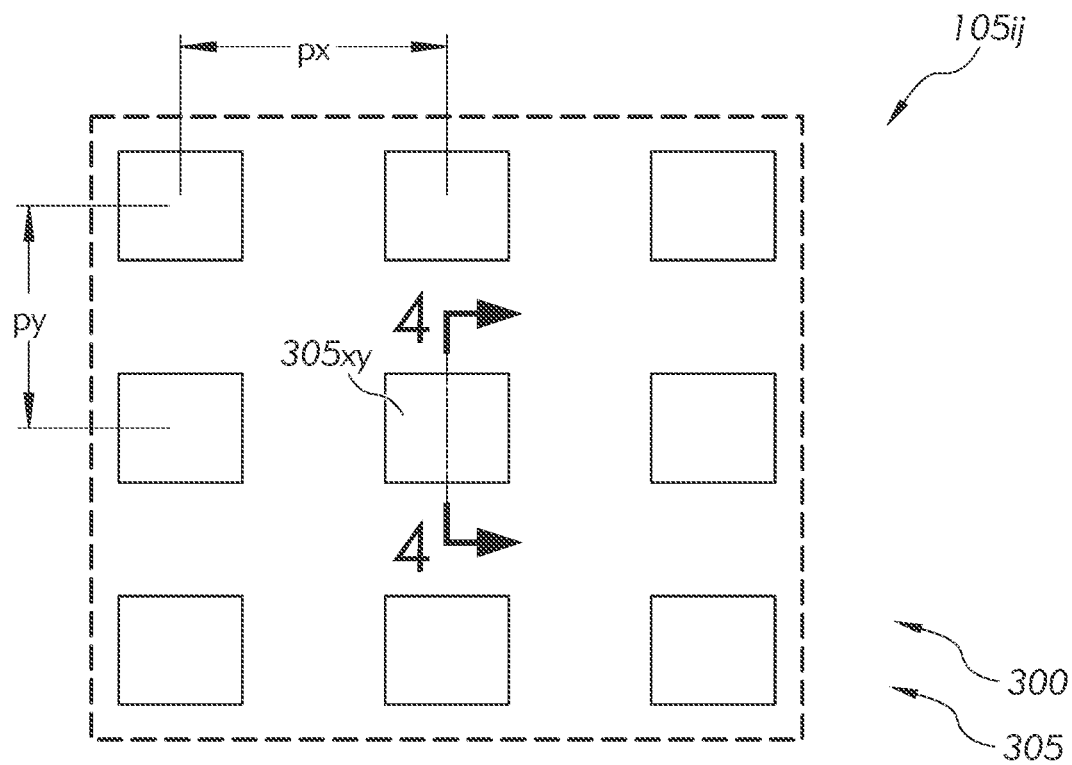
FIG. 3 illustrates an enlarged view of a portion of the tile as shown by view 3 of FIG. 2 including a plurality of microLEDs defining a plurality of pixels in accordance with embodiments of the disclosure.

FIG. 3 illustrates an enlarged view of a portion of the tile 105ij as shown by view 3 of FIG. 2 including a plurality of micrometer-sized light emitting diodes (microLEDs) 300 defining a plurality of pixels 305. For clarity purposes, a glass or film 401 (See FIG. 4) and a substrate 402 (See FIG. 4) are not illustrated in FIG. 3. In some embodiments, a lateral distance "px" and/or "py" between immediately adjacent pixels of the plurality of pixels 305 can define a pixel pitch. In some embodiments, px can equal py, and in some embodiments, px can be different than py. In some embodiments, at least one of the pixel pitch (px, py) can be from about 50 micrometers to about 1000 micrometers, including all ranges and subranges therebetween. For example, in some embodiments, at least one of the pixel pitch (px, py) can be from about 100 micrometers to about 200 micrometers, from about 100 micrometers to about 300 micrometers, from about 100 micrometers to about 400 micrometers, from about 100 micrometers to about 500 micrometers, from about 500 micrometers to about 600 micrometers, from about 600 micrometers to about 700 micrometers, from about 700 micrometers to about 800 micrometers, from about 800 micrometers to about 900 micrometers, from about 900 micrometers to about 1000 micrometers. In some embodiments, at least one of the pixel pitch (px, py) can be less than 50 micrometers, for example, from about 0 micrometers to about 50 micrometers, including all ranges and subranges therebetween, or greater than 1000 micrometers, for example, from about 1 millimeter to about 3 millimeters, including all ranges and subranges therebetween.

In some embodiments, the nominal tile 200 can include a first lateral dimension D1 within a range of from about 10 mm to about 100 cm, including all ranges and subranges therebetween, and a second lateral dimension D2 within a range of from about 10 mm to about 100 cm, including all ranges and subranges therebetween. In some embodiments, the first lateral dimension D1 and the second lateral dimension D2 can be selected based on the particular application in which the display device including the display area may be employed. For example, turning back to FIG. 2, in an exemplary embodiment, the nominal tile 200 can include a first lateral dimension D1 of about 100.44 mm and a second lateral dimension D2 of about 178.56 mm, as provided in TABLE 1. Additionally, with respect to the nominal tile, D3 can equal D4, and the squareness (D3-D4) can, therefore, equal zero. Likewise, with respect to the nominal tile 200, the edge straightness (D5, D6, D7, D8) can equal zero.

TABLE 1

| Nominal Tile | Value [mm] |
| --- | --- |
| D1 | 100.44 |
| D2 | 178.56 |
| D3-D4 | 0 |
| D5, D6, D7, D8 | 0 |

Additionally, TABLE 2 provides a respective number of pixels per each tile for the indicated pixel pitches of from 50 micrometers to 500 micrometers (where px equals py) for the nominal tile 200 including the first lateral dimension D1 of about 100.44 mm and the second lateral dimension D2 of about 178.56 mm.

TABLE 2

| Pixel Pitch [um] | Pixels/Tile |
| --- | --- |
| 50 | 7173827 |
| 100 | 1793457 |
| 150 | 797092 |
| 200 | 448364 |
| 250 | 286953 |
| 300 | 199273 |
| 350 | 146405 |
| 400 | 112091 |
| 450 | 88566 |
| 500 | 71738 |

Moreover, turning back to FIG. 1, for the nominal tile 200 including the first lateral dimension D1 of about 100.44 mm and the second lateral dimension D2 of about 178.56 mm, TABLE 3 provides the nominal (n) dimension, the nominal (m) dimension, and the corresponding diagonal dimension of the display area 101 for respective n×m arrays.

TABLE 3

| Array | (n) Dimension [mm] | (m) Dimension [mm] | Display Diagonal [mm] |
| --- | --- | --- | --- |
| 5 × 5 | 502.20 | 892.80 | 1023.62 |
| 6 × 6 | 602.64 | 1071.36 | 1229.36 |
| 7 × 7 | 703.08 | 1249.92 | 1435.10 |
| 8 × 8 | 803.52 | 1428.48 | 1638.30 |
| 9 × 9 | 903.96 | 1607.04 | 1844.04 |
| 10 × 10 | 1004.40 | 1785.60 | 2049.78 |

Figure 4:
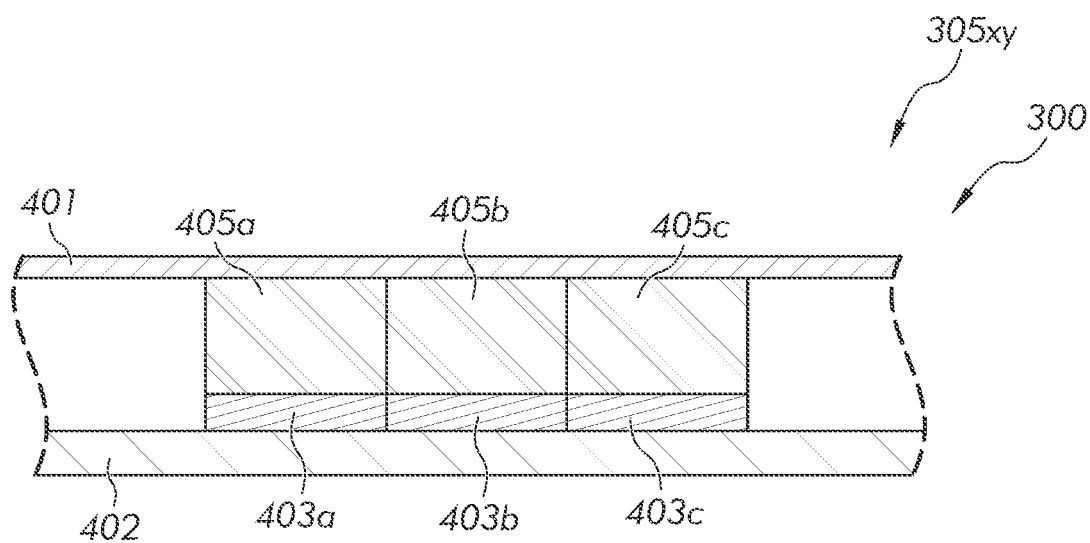
FIG. 4 shows a cross-sectional view of a pixel of the plurality of pixels including at least one microLED of the plurality of microLEDs taken along line 4-4 of FIG. 3 in accordance with embodiments of the disclosure.

FIG. 4 shows a cross-sectional view of a pixel 305xy of the plurality of pixels 305 taken along line 4-4 of FIG. 3, where the pixel 305xy can be representative of one or more individual pixels of the plurality of pixels 305 including the plurality of microLEDs 300. In some embodiments, the pixel 305xy can include three microLEDs (e.g., a first microLED 405a, a second microLED 405b, a third microLED 405c) that define the pixel 305xy. For example, in some embodiments, one of the microLEDs (e.g., first microLED 405a) can include a red microLED, another one of the microLEDs (e.g., second microLED 405b) can include a green microLED, and another one of the microLEDs (e.g., third microLED 405c) can include a blue microLED. Additionally, in some embodiments, the first microLED 405a can include a first electrode 403a to control an operation of the first microLED 405a, the second microLED 405b can include a second electrode 403b to control an operation of the second microLED 405b, and the third microLED 405c can include a third electrode 403c to control an operation of the third microLED 405c. In some embodiments, the pixel 305xy can include additional elements and components (e.g., thin film transistors) for electrically controlling and operating the microLEDs 405a, 405b, 405c. In some embodiments, each microLED 405a, 405b, 405c can include a dimension defining a light emitting region of from about 10 micrometers to about 200 micrometers, including all ranges and subranges therebetween. For example, in some embodiments, each microLED 405a, 405b, 405c can include a dimension defining a light emitting region of from about 10 micrometers to about 20 micrometers, from about 10 micrometers to about 50 micrometers, from about 50 micrometers to about 100 micrometers, from about 100 micrometers to about 200 micrometers.

Moreover, in some embodiments, the first microLED 405a, the second microLED 405b, the third microLED 405c, and the respective first electrode 403a, second electrode 403b, and third electrode 403c can be connected to a substrate 402. In some embodiments, a glass or film 401 can be provided opposite the substrate 402 with the microLEDs 405a, 405b, 405c and the electrodes 403a, 403b, 403c positioned between the glass or film 401 and the substrate 402. In some embodiments, by controlling, for example, an electrical current supplied to each of the respective red, green, and blue microLEDs 405a, 405b, 405c with the respective electrodes 403a, 403b, 403c, the pixel 305xy can provide a broad color spectrum of visible light based on additive color mixing. In some embodiments, the pixel 305xy can include a single microLED for monochrome emission, where a color display can be achieved through color conversion. Likewise, in some embodiments, the pixel 305xy can include a single microLED provided as a multi-color LED, one or more blue or white LEDs provided with color filters, or other semiconductor light sources provided as a micro-sized diode to emit light in accordance with embodiments of the disclosure, without departing from the scope of the disclosure. Additionally, in some embodiments, microLEDs can provide lower power consumption and higher contrast ratio than, for example, standard light emitting diodes (LEDs) and liquid crystal displays (LCDs) as well as longer lifetime operability than, for example, organic light emitting diodes (OLEDs).

Turning back to FIG. 2, and with reference to TABLES 4-23, a plurality of tiles were cut based on nominal dimensions of TABLE 1 using four different cutting techniques. Additionally, corresponding predetermined parameters (e.g., D1-D8) of each tile were measured and recorded. Deviations of the measured values of the predetermined parameters relative to the nominal values of the predetermined parameters can be attributed, in some embodiments, to accuracy, precision, and tolerances of each respective cutting technique. Additionally, in some embodiments, two or more different cutting techniques can be employed to cut one or more edges of each tile of the plurality of tiles.

For example, a first cutting technique (Cutting Technique 1) was employed using a standard semiconductor dicing saw to cut 56 tiles. TABLES 4-8 provide measured values and a corresponding frequency of the predetermined parameters of each tile cut by Cutting Technique 1. In some embodiments, where the total frequency of tiles differs from the 56 tiles cut using Cutting Technique 1, it is to be understood that the particular measurement may be omitted based at least on an error or discrepancy, where such omission is deemed to not alter the statistical significance of the measured values. In particular, TABLE 4 provides measured values of the first lateral dimension D1 and the corresponding frequency of the measured values of the plurality of tiles cut with Cutting Technique 1.

TABLE 4

| Cutting Technique 1 | |
|---|---|
| D1 [mm] | freq |
| 99.999 | 1 |
| 100.000 | 3 |
| 100.001 | 3 |
| 100.002 | 1 |
| 100.004 | 2 |

TABLE 4-continued

| Cutting Technique 1 | |
|---|---|
| D1 [mm] | freq |
| 100.005 | 2 |
| 100.006 | 4 |
| 100.007 | 2 |
| 100.008 | 5 |
| 100.009 | 3 |
| 100.010 | 6 |
| 100.011 | 2 |
| 100.012 | 6 |
| 100.013 | 2 |
| 100.014 | 4 |
| 100.015 | 4 |
| 100.016 | 1 |
| 100.017 | 2 |
| 100.019 | 2 |
| 100.023 | 1 |

TABLE 5 provides measured values of the second lateral dimension D2 and the corresponding frequency of the measured values of the plurality of tiles cut with Cutting Technique 1.

TABLE 5

| Cutting Technique 1 | |
|---|---|
| D2 [mm] | freq |
| 180.400 | 5 |
| 180.402 | 6 |
| 180.404 | 1 |
| 180.406 | 4 |
| 180.408 | 6 |
| 180.410 | 10 |
| 180.412 | 9 |
| 180.414 | 8 |
| 180.416 | 3 |
| 180.418 | 1 |
| 180.420 | 2 |
| 180.428 | 1 |

TABLE 6 provides measured values of the squareness (D3-D4) and the corresponding frequency of the measured values of the plurality of tiles cut with Cutting Technique 1.

TABLE 6

| Cutting Technique 1 | |
|---|---|
| Squareness [mm] | freq |
| 0.00000 | 1 |
| 0.00025 | 2 |
| 0.00050 | 1 |
| 0.00075 | 5 |
| 0.00100 | 2 |
| 0.00125 | 3 |
| 0.00150 | 5 |
| 0.00175 | 2 |
| 0.00200 | 4 |
| 0.00225 | 6 |
| 0.00250 | 2 |
| 0.00275 | 3 |
| 0.00300 | 4 |
| 0.00325 | 5 |
| 0.00350 | 1 |
| 0.00375 | 3 |
| 0.00400 | 2 |
| 0.00425 | 1 |
| 0.00475 | 1 |
| 0.00550 | 2 |
| 0.00600 | 1 |

TABLE 7 provides measured values of the straightness (D5, D6) relative to the first lateral dimension D1 and the corresponding frequency of the measured values of the plurality of tiles cut with Cutting Technique 1.

TABLE 7

| Cutting Technique 1 | |
| --- | --- |
| Straightness D1 [mm] | freq |
| 0.004 | 1 |
| 0.005 | 7 |
| 0.006 | 13 |
| 0.007 | 14 |
| 0.008 | 16 |
| 0.009 | 16 |
| 0.010 | 6 |
| 0.011 | 8 |
| 0.012 | 6 |
| 0.013 | 6 |
| 0.014 | 7 |
| 0.015 | 1 |
| 0.016 | 4 |
| 0.017 | 2 |
| 0.021 | 1 |
| 0.022 | 1 |
| 0.025 | 1 |
| 0.027 | 1 |
| 0.029 | 1 |

TABLE 8 provides measured values of the straightness (D7, D8) relative to the second lateral dimension D2 and the corresponding frequency of the measured values of the plurality of tiles cut with Cutting Technique 1.

TABLE 8

| Cutting Technique 1 | |
| --- | --- |
| Straightness D2 [mm] | freq |
| 0.002 | 1 |
| 0.003 | 25 |
| 0.004 | 22 |
| 0.005 | 22 |
| 0.006 | 11 |
| 0.007 | 9 |
| 0.008 | 7 |
| 0.009 | 4 |
| 0.010 | 1 |
| 0.011 | 4 |
| 0.012 | 2 |
| 0.015 | 1 |
| 0.019 | 1 |
| 0.022 | 1 |

A second cutting technique (Cutting Technique 2) was employed using a MP500 precision mechanical scribe manufactured by MDI Advanced Processing to cut 52 tiles. TABLES 9-13 provide measured values of the predetermined parameters of each tile cut by Cutting Technique 2. In some embodiments, where the total frequency of tiles differs from the 52 tiles cut using Cutting Technique 2, it is to be understood that the particular measurement may be omitted based at least on an error or discrepancy, where such omission is deemed to not alter the statistical significance of the measured values. In particular, TABLE 9 provides measured values of the first lateral dimension D1 and the corresponding frequency of the measured values of the plurality of tiles cut with Cutting Technique 2.

TABLE 9

| Cutting Technique 2 | |
| --- | --- |
| D1 [mm] | freq |
| 100.0045 | 1 |
| 100.0050 | 1 |
| 100.0055 | 1 |
| 100.0060 | 3 |
| 100.0065 | 6 |
| 100.0070 | 6 |
| 100.0075 | 5 |
| 100.0080 | 2 |
| 100.0085 | 5 |
| 100.0090 | 5 |
| 100.0095 | 3 |
| 100.0100 | 3 |
| 100.0105 | 3 |
| 100.0120 | 1 |
| 100.0125 | 3 |
| 100.0150 | 2 |
| 100.0165 | 1 |

TABLE 10 provides measured values of the second lateral dimension D2 and the corresponding frequency of the measured values of the plurality of tiles cut with Cutting Technique 2.

TABLE 10

| Cutting Technique 2 | |
| --- | --- |
| D2 [mm] | freq |
| 179.998 | 1 |
| 180.006 | 1 |
| 180.008 | 4 |
| 180.010 | 2 |
| 180.012 | 4 |
| 180.014 | 8 |
| 180.016 | 7 |
| 180.018 | 8 |
| 180.020 | 1 |
| 180.022 | 5 |
| 180.024 | 1 |
| 180.026 | 4 |
| 180.028 | 1 |
| 180.030 | 2 |
| 180.032 | 1 |
| 180.040 | 1 |

TABLE 11 provides measured values of the squareness (D3-D4) and the corresponding frequency of the measured values of the plurality of tiles cut with Cutting Technique 2.

TABLE 11

| Cutting Technique 2 | |
| --- | --- |
| Squareness [mm] | freq |
| 0.001 | 4 |
| 0.003 | 2 |
| 0.004 | 3 |
| 0.005 | 4 |
| 0.006 | 8 |
| 0.007 | 7 |
| 0.008 | 8 |
| 0.010 | 5 |
| 0.011 | 6 |
| 0.012 | 2 |
| 0.013 | 1 |
| 0.018 | 1 |

TABLE 12 provides measured values of the straightness (D5, D6) relative to the first lateral dimension D1 and the corresponding frequency of the measured values of the plurality of tiles cut with Cutting Technique 2.

TABLE 12

| Cutting Technique 2 | |
|---|---|
| Straightness D1 [mm] | freq |
| 0.008 | 8 |
| 0.012 | 39 |
| 0.016 | 20 |
| 0.020 | 11 |
| 0.024 | 11 |
| 0.028 | 5 |
| 0.032 | 1 |
| 0.040 | 2 |
| 0.044 | 3 |
| 0.068 | 1 |
| 0.072 | 1 |
| 0.084 | 1 |

TABLE 13 provides measured values of the straightness (D7, D8) relative to the second lateral dimension D2 and the corresponding frequency of the measured values of the plurality of tiles cut with Cutting Technique 2.

TABLE 13

| Cutting Technique 2 | |
|---|---|
| Straightness D2 [mm] | freq |
| 0.0075 | 15 |
| 0.0100 | 26 |
| 0.0125 | 19 |
| 0.0150 | 12 |
| 0.0175 | 8 |
| 0.0200 | 10 |
| 0.0225 | 4 |
| 0.0250 | 2 |
| 0.0275 | 3 |
| 0.0300 | 1 |
| 0.0375 | 1 |
| 0.0425 | 1 |
| 0.0450 | 1 |

A third cutting technique (Cutting Technique 3) was employed using a non-diffracting beam CLT Laser cutting process to cut 41 tiles. TABLES 14-18 provide measured values of the predetermined parameters of each tile cut by Cutting Technique 3. In some embodiments, where the total frequency of tiles differs from the 41 tiles cut using Cutting Technique 3, it is to be understood that the particular measurement may be omitted based at least on an error or discrepancy, where such omission is deemed to not alter the statistical significance of the measured values. In particular, TABLE 14 provides measured values of the first lateral dimension D1 and the corresponding frequency of the measured values of the plurality of tiles cut with Cutting Technique 3.

TABLE 14

| Cutting Technique 3 | |
|---|---|
| D1 [mm] | freq |
| 100.0070 | 1 |
| 100.0074 | 1 |
| 100.0076 | 1 |
| 100.0078 | 1 |
| 100.0080 | 1 |
| 100.0082 | 4 |

TABLE 14-continued

| Cutting Technique 3 | |
|---|---|
| D1 [mm] | freq |
| 100.0084 | 2 |
| 100.0086 | 4 |
| 100.0088 | 2 |
| 100.0090 | 3 |
| 100.0092 | 4 |
| 100.0094 | 4 |
| 100.0096 | 3 |
| 100.0098 | 1 |
| 100.0100 | 1 |
| 100.0102 | 2 |
| 100.0106 | 2 |
| 100.0110 | 1 |
| 100.0112 | 1 |
| 100.0114 | 1 |
| 100.0116 | 1 |

TABLE 15 provides measured values of the second lateral dimension D2 and the corresponding frequency of the measured values of the plurality of tiles cut with Cutting Technique 3.

TABLE 15

| Cutting Technique 3 | |
|---|---|
| D2 [mm] | freq |
| 179.990 | 2 |
| 179.994 | 3 |
| 180.002 | 9 |
| 180.006 | 6 |
| 180.010 | 12 |
| 180.014 | 2 |
| 180.034 | 7 |

TABLE 16 provides measured values of the squareness (D3-D4) and the corresponding frequency of the measured values of the plurality of tiles cut with Cutting Technique 3.

TABLE 16

| Cutting Technique 3 | |
|---|---|
| Squareness [mm] | freq |
| 0.0006 | 2 |
| 0.0014 | 1 |
| 0.0018 | 2 |
| 0.0022 | 2 |
| 0.0030 | 2 |
| 0.0034 | 2 |
| 0.0038 | 2 |
| 0.0042 | 2 |
| 0.0050 | 1 |
| 0.0054 | 1 |
| 0.0058 | 3 |
| 0.0062 | 3 |
| 0.0066 | 2 |
| 0.0070 | 4 |
| 0.0090 | 1 |
| 0.0094 | 1 |
| 0.0102 | 1 |
| 0.0106 | 4 |
| 0.0110 | 1 |
| 0.0118 | 2 |
| 0.0122 | 2 |

TABLE 17 provides measured values of the straightness (D5, D6) relative to the first lateral dimension D1 and the corresponding frequency of the measured values of the plurality of tiles cut with Cutting Technique 3.

TABLE 17

| Cutting Technique 3 | |
|---|---|
| Straightness D1 [mm] | freq |
| 0.009 | 12 |
| 0.012 | 20 |
| 0.015 | 5 |
| 0.018 | 7 |
| 0.021 | 5 |
| 0.024 | 7 |
| 0.027 | 3 |
| 0.030 | 2 |
| 0.033 | 3 |
| 0.036 | 2 |
| 0.039 | 5 |
| 0.042 | 1 |
| 0.045 | 2 |
| 0.048 | 3 |
| 0.051 | 1 |
| 0.057 | 3 |
| 0.063 | 1 |

TABLE 18 provides measured values of the straightness (D7, D8) relative to the second lateral dimension D2 and the corresponding frequency of the measured values of the plurality of tiles cut with Cutting Technique 3.

TABLE 18

| Cutting Technique 3 | |
|---|---|
| Straightness D2 [mm] | freq |
| 0.004 | 3 |
| 0.006 | 18 |
| 0.008 | 12 |
| 0.010 | 6 |
| 0.012 | 11 |
| 0.014 | 8 |
| 0.016 | 3 |
| 0.018 | 6 |
| 0.020 | 3 |
| 0.022 | 3 |
| 0.024 | 2 |
| 0.026 | 4 |
| 0.028 | 2 |
| 0.036 | 1 |

A fourth cutting technique (Cutting Technique 4) was employed using a TLC International Phoenix brand (e.g., Gen-3, Gen-5) mechanical glass-cutting machine tool employing a precision scribe and break process to cut 48 tiles. TABLES 19-23 provide measured values of the predetermined parameters of each tile cut by Cutting Technique 4. In some embodiments, where the total frequency of tiles differs from the 48 tiles cut using Cutting Technique 4, it is to be understood that the particular measurement may be omitted based at least on an error or discrepancy, where such omission is deemed to not alter the statistical significance of the measured values. In particular, TABLE 19 provides measured values of the first lateral dimension D1 and the corresponding frequency of the measured values of the plurality of tiles cut with Cutting Technique 4.

TABLE 19

| Cutting Technique 4 | |
|---|---|
| D1 [mm] | freq |
| 99.90 | 1 |
| 99.93 | 12 |

TABLE 19-continued

| Cutting Technique 4 | |
|---|---|
| D1 [mm] | freq |
| 99.94 | 10 |
| 99.97 | 1 |
| 100.03 | 1 |
| 100.12 | 2 |
| 100.13 | 15 |
| 100.14 | 6 |

TABLE 20 provides measured values of the second lateral dimension D2 and the corresponding frequency of the measured values of the plurality of tiles cut with Cutting Technique 4.

TABLE 20

| Cutting Technique 4 | |
|---|---|
| D2 [mm] | freq |
| 179.93 | 2 |
| 179.94 | 11 |
| 179.95 | 6 |
| 179.96 | 1 |
| 179.98 | 1 |
| 179.99 | 1 |
| 180.09 | 1 |
| 180.11 | 1 |
| 180.13 | 1 |
| 180.14 | 4 |
| 180.15 | 15 |

TABLE 21 provides measured values of the squareness (D3-D4) and the corresponding frequency of the measured values of the plurality of tiles cut with Cutting Technique 4.

TABLE 21

| Cutting Technique 4 | |
|---|---|
| Squareness [mm] | freq |
| 0.002 | 1 |
| 0.003 | 3 |
| 0.004 | 2 |
| 0.005 | 1 |
| 0.006 | 3 |
| 0.007 | 2 |
| 0.008 | 3 |
| 0.009 | 5 |
| 0.011 | 1 |
| 0.012 | 3 |
| 0.013 | 4 |
| 0.014 | 4 |
| 0.015 | 5 |
| 0.016 | 4 |
| 0.017 | 2 |
| 0.022 | 1 |

TABLE 22 provides measured values of the straightness (D5, D6) relative to the first lateral dimension D1 and the corresponding frequency of the measured values of the plurality of tiles cut with Cutting Technique 4.

TABLE 22

| Cutting Technique 4 | |
| --- | --- |
| Straightness D1 [mm] | freq |
| 0.036 | 2 |
| 0.038 | 1 |
| 0.042 | 4 |
| 0.044 | 4 |
| 0.046 | 7 |
| 0.048 | 7 |
| 0.050 | 11 |
| 0.052 | 7 |
| 0.054 | 5 |
| 0.056 | 5 |
| 0.058 | 5 |
| 0.060 | 4 |
| 0.062 | 4 |
| 0.064 | 8 |
| 0.066 | 2 |
| 0.068 | 4 |
| 0.070 | 5 |
| 0.072 | 2 |
| 0.076 | 1 |
| 0.078 | 1 |

TABLE 23 provides measured values of the straightness (D7, D8) relative to the second lateral dimension D2 and the corresponding frequency of the measured values of the plurality of tiles cut with Cutting Technique 4.

TABLE 23

| Cutting Technique 4 | |
| --- | --- |
| Straightness D2 [mm] | freq |
| 0.020 | 2 |
| 0.025 | 2 |
| 0.030 | 2 |
| 0.035 | 2 |
| 0.040 | 3 |
| 0.045 | 9 |
| 0.050 | 14 |
| 0.055 | 14 |
| 0.060 | 8 |
| 0.065 | 11 |
| 0.070 | 6 |
| 0.075 | 3 |
| 0.080 | 4 |
| 0.085 | 3 |
| 0.090 | 1 |
| 0.095 | 2 |
| 0.105 | 1 |
| 0.125 | 1 |
| 0.130 | 1 |

Employing the measured values of TABLES 4-23, a computer simulation was implemented to randomly generate a plurality of tiles, where each randomly generated tile includes predetermined parameters (D1-D8) that are statistically representative of the measured values. For example, by employing the measured values, a computer simulation can randomly generate a statistically large number of tiles (e.g., 100,000 tiles, 250,000 tiles, 500,000 tiles, 1,000,000 tiles, 10,000,000 tiles, 100,000,000 tiles, etc.) accurately representing predetermined parameters of the statistically large number of tiles that would be produced by physically cutting tiles, without physically cutting and producing the statistically large number of tiles. In some embodiments, the measured values of each predetermined parameter (e.g., first lateral dimension D1, second lateral dimension D2, squareness (D3-D4), D1 straightness (D5, D6), and D2 straightness (D7, D8)) of each cutting technique (e.g., Cutting Techniques 1-4) can be numerically fit with a statistical distribution from which the values of the predetermined parameters of the statistically large number of tiles can be randomly generated. In particular, EQUATION 1 provides a normal (Gaussian) distribution and associated variables by which some of the predetermined parameters of the statistically large number of tiles can be determined based on the measured values:

$$y(x) = \frac{A}{\sqrt{2\pi\sigma^2}} e^{-\frac{(x-\mu)^2}{2\sigma^2}}$$ EQUATION 1

$\mu$ = mean $\sigma$ = SD $A = n \cdot a$ $n$ = number of samples $a$ = increment between values Similarly, EQUATION 2 provides a combined normal (Gaussian) distribution and associated variables by which some of the predetermined parameters of the statistically large number of tiles can be determined based on the measured values:

$$y(x) = \frac{A_1}{\sqrt{2\pi\sigma_1^2}} e^{-\frac{(x-\mu_1)^2}{2\sigma_1^2}} + \frac{A_2}{\sqrt{2\pi\sigma_2^2}} e^{-\frac{(x-\mu_2)^2}{2\sigma_2^2}}$$ EQUATION 2

$\mu_1$ = mean, left side $\mu_2$ = mean, right side $\sigma_1$ = SD, left side $\sigma_2$ = SD, right side $A_1 = n_1 \cdot a_1$ $n_1$ = number of samples, left side $a_1$ = increment between values, left side $A_2 = n_2 \cdot a_2$ $n_2$ = number of samples, right side $a_2$ = increment between values, right side Likewise, EQUATION 3 provides a log-normal distribution and associated variables by which some of the predetermined parameters of the statistically large number of tiles can be determined based on the measured values:

$$y(x) = \frac{A}{x\sigma\sqrt{2\pi}} e^{-\frac{(\ln x - \mu)^2}{2\sigma^2}}$$ EQUATION 3

$$\mu = \ln\left(\frac{m}{\sqrt{1 + \frac{v}{m^2}}}\right)$$

-continued $$\sigma = \sqrt{\ln\left(1 + \frac{v}{m^2}\right)}$$

m = mean v = variance = $SD^2$ $A = n \cdot a$ n = number of samples a = increment between values Accordingly, in some embodiments, depending on the distribution of the data, one of EQUATIONS 1-3 was employed in combination with the measured values of each of the predetermined parameters (D1-D8) of the tiles cut by each of the Cutting Techniques 1-4 to randomly generate predetermined parameters for each tile of the statistically large number of tiles. For example, TABLES 24-43 provide the calculated variables that are determined based on the measured values of TABLES 4-23 and used in combination with one of EQUATIONS 1-3 to calculate the predetermined parameters for each tile of the statistically large number of randomly generated tiles of Cutting Techniques 1-4. For purposes of the calculations, it is assumed that all edges of the tile have the same distribution; however, in some embodiments, one or more edges of the tile may have different distributions and may be provided by one or more different cutting techniques or edge processing techniques (e.g., grinding, polishing). In particular, for predetermined parameters randomly generated based on EQUATION 1, the term "(normal)" is listed in the table showing the respective variables calculated based on the measured values and the corresponding normal distribution and associated variables. Likewise, for predetermined parameters randomly generated based on EQUATION 2, the term "(combined)" is listed in the table showing the respective variables calculated based on the measured values and the corresponding combined normal distribution and associated variables. Similarly, for predetermined parameters randomly generated based on EQUATION 3, the term "(ln)" is listed in the table showing the respective variables calculated based on the measured values and the corresponding log-normal distribution and associated variables.

In particular, TABLES 24-28 provide the calculated variables that are respectively determined based on the measured values of TABLES 4-8 (e.g., first lateral dimension D1, second lateral dimension D2, squareness (D3-D4), D1 straightness (D5, D6), and D2 straightness (D7, D8)) and used in combination with one of EQUATIONS 1-3 (as identified) to randomly generate the predetermined parameters for each tile of the statistically large number of tiles of Cutting Technique 1.

TABLE 24

| Cutting Technique 1 D1 (normal) | |
|---|---|
| A | 0.061701 |
| μ | 100.010497 |
| σ | 0.004673 |
| n | 56 |
| increment | 0.001 |

TABLE 25

| Cutting Technique 1 D2 (normal) | |
|---|---|
| A | 0.084304 |
| μ | 180.410749 |
| σ | 0.003399 |
| n | 56 |
| increment | 0.002 |

TABLE 26

| Cutting Technique 1 Squareness (normal) | |
|---|---|
| A | 0.014192 |
| μ | 0.002345 |
| σ | 0.001371 |
| n | 56 |
| increment | 0.00025 |

TABLE 27

| Cutting Technique 1 Straightness D1 (ln) | |
|---|---|
| A | 0.105273 |
| μ | −4.774432 |
| σ | 0.323590 |
| n | 112 |
| increment | 0.001 |

TABLE 28

| Cutting Technique 1 Straightness D2 (ln) | |
|---|---|
| A | 0.105789 |
| μ | −5.368067 |
| σ | 0.412470 |
| n | 111 |
| increment | 0.001 |

Additionally, TABLES 29-33 provide the calculated variables that are respectively determined based on the measured values of TABLES 9-13 (e.g., first lateral dimension D1, second lateral dimension D2, squareness (D3-D4), D1 straightness (D5, D6), and D2 straightness (D7, D8)) and used in combination with one of EQUATIONS 1-3 (as identified) to randomly generate the predetermined parameters for each tile of the statistically large number of tiles of Cutting Technique 2.

TABLE 29

| Cutting Technique 2 D1 (normal) | |
|---|---|
| A | 0.023591 |
| μ | 100.007895 |
| σ | 0.001783 |
| n | 51 |
| increment | 0.0005 |

TABLE 30

Cutting Technique 2
D2 (normal)

| | |
|---|---|
| A | 0.099161 |
| μ | 180.017120 |
| σ | 0.005532 |
| n | 51 |
| increment | 0.002 |

TABLE 31

Cutting Technique 2
Squareness (normal)

| | |
|---|---|
| A | 0.049845 |
| μ | 0.007627 |
| σ | 0.002713 |
| n | 51 |
| increment | 0.001 |

TABLE 32

Cutting Technique 2
Straightness D1 (ln)

| | |
|---|---|
| A | 0.289375 |
| μ | -4.230247 |
| σ | 0.322271 |
| n | 103 |
| increment | 0.004 |

TABLE 33

Cutting Technique 2
Straightness D2 (ln)

| | |
|---|---|
| A | 0.239993 |
| μ | -4.400247 |
| σ | 0.402618 |
| n | 103 |
| increment | 0.0025 |

Additionally, TABLES 34-38 provide the calculated variables that are respectively determined based on the measured values of TABLES 14-18 (e.g., first lateral dimension D1, second lateral dimension D2, squareness (D3-D4), D1 straightness (D5, D6), and D2 straightness (D7, D8)) and used in combination with one of EQUATIONS 1-3 (as identified) to randomly generate the predetermined parameters for each tile of the statistically large number of tiles of Cutting Technique 3.

TABLE 34

Cutting Technique 3
D1 (normal)

| | |
|---|---|
| A | 0.007848 |
| μ | 100.009255 |
| σ | 0.001012 |
| n | 41 |
| increment | 0.0002 |

TABLE 35

Cutting Technique 3
D2 (normal)

| | |
|---|---|
| A | 0.097189 |
| μ | 180.008736 |
| σ | 0.002953 |
| n | 41 |
| increment | 0.004 |

TABLE 36

Cutting Technique 3
Squareness (normal)

| | |
|---|---|
| A | 0.024709 |
| μ | 0.003598 |
| σ | 0.004925 |
| n | 41 |
| increment | 0.0004 |

TABLE 37

Cutting Technique 3
Straightness D1 (ln)

| | |
|---|---|
| A | 0.194481 |
| μ | -3.975518 |
| σ | 0.614340 |
| n | 82 |
| increment | 0.003 |

TABLE 38

Cutting Technique 3
Straightness D2 (ln)

| | |
|---|---|
| A | 0.155278 |
| μ | -4.477293 |
| σ | 0.508459 |
| n | 82 |
| increment | 0.002 |

Additionally, TABLES 39-43 provide the calculated variables that are respectively determined based on the measured values of TABLES 19-23 (e.g., first lateral dimension D1, second lateral dimension D2, squareness (D3-D4), D1 straightness (D5, D6), and D2 straightness (D7, D8)) and used in combination with one of EQUATIONS 1-3 (as identified) to randomly generate the predetermined parameters for each tile of the statistically large number of tiles of Cutting Technique 4.

TABLE 39

Cutting Technique 4
D1 (combined)

| | |
|---|---|
| A1 | 0.084886 |
| A2 | 0.172186 |
| μ1 | 99.930012 |
| μ2 | 100.127675 |
| σ1 | 0.002822 |
| σ2 | 0.003806 |
| n | 48 |
| increment | 0.01 |

TABLE 40

Cutting Technique 4
D2 (combined)

| | |
|---|---|
| A1 | 0.081416 |
| A2 | 0.136028 |
| μ1 | 179.939839 |
| μ2 | 180.152107 |
| σ1 | 0.002948 |
| σ2 | 0.002348 |
| n | 44 |
| increment | 0.01 |

TABLE 41

Cutting Technique 4
Squareness (normal)

| | |
|---|---|
| A | 0.046461 |
| μ | 0.011593 |
| σ | 0.004478 |
| n | 44 |
| increment | 0.001 |

TABLE 42

Cutting Technique 4
Straightness D1 (ln)

| | |
|---|---|
| A | 0.168655 |
| μ | -2.931805 |
| σ | 0.208692 |
| n | 89 |
| increment | 0.002 |

TABLE 43

Cutting Technique 4
Straightness D2 (ln)

| | |
|---|---|
| A | 0.424900 |
| μ | -2.857647 |
| σ | 0.215864 |
| n | 89 |
| increment | 0.005 |

Moreover, in some embodiments, a further computer simulation can be implemented to simulate assembly of the statistically large number of tiles including the randomly generated predetermined parameters D1-D8 into (n×m) arrays of various sizes. In some embodiments, practical methods of assembling a display area can be employed with one or more strategies based on information obtained by the computer simulation. As discussed more fully below, in some embodiments, employing the one or more strategies can provide one or more advantages with respect to the assembly and positioning of the plurality of tiles into the array that may not otherwise be obtainable without employing the one or more strategies.

For example, in some embodiments, a computer simulation can simulate assembly of each of the randomly generated tiles into one of a variety of arrays. In some embodiments, each tile can be positioned in the array based on a global position method where positioning of the tile is based on a predetermined global spatial coordinate irrespective of the relative position of other tiles. Alternatively, in some embodiments, each tile can be positioned in the array based on a relative position method where positioning of the tile is based on a relative position of immediately adjacent tiles (i.e. one or more tiles positioned directly next to each other without other tiles therebetween) irrespective of the global spatial coordinate of the tile. Moreover, in some embodiments, whether employed with the global position method or the relative position method, during the simulation, if a tile is positioned in an overlapping relationship relative to one or more immediately adjacent tiles, the simulation can selectively adjust the position of the tile relative to the one or more immediately adjacent tiles such that the tile is positioned into the array in a non-overlapping relationship relative to the one or more immediately adjacent tiles.

Figure 5:
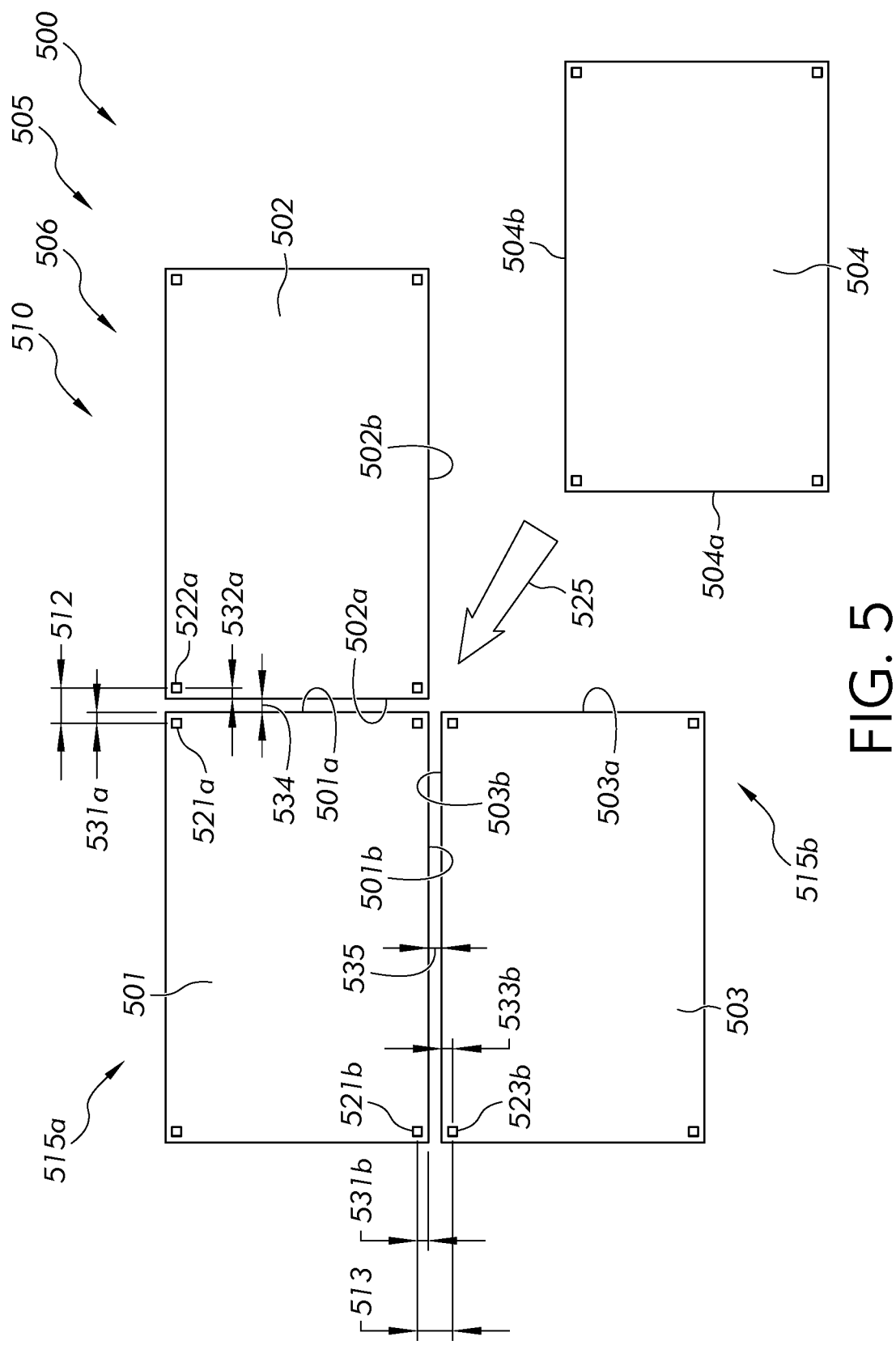
FIG. 5 illustrates an exemplary method of assembling a display area in accordance with embodiments of the disclosure.

Turning to FIG. 5, methods of assembling a display area 510 of a display device 500 will now be described with the understanding that one or more features of the display area 101 and the display device 100 can be provided alone or in combination with one or more features of the display area 510 and the display device 500. It is to be understood that the methods of assembling the display area 510 can be employed as a computer simulation and/or as an actual method of assembling a display area 510 to be employed in one or more display devices 500 in accordance with embodiments of the disclosure.

In some embodiments, the method can include providing a plurality of tiles 505 (e.g., a first tile 501, a second tile 502, a third tile 503, and a fourth tile 504) with the understanding that each tile 501, 502, 503, 504 of the plurality of tiles 505 can include one or more features of the tile 105ij of the plurality of tiles 105 including one or more predetermined parameters (See FIG. 2, predetermined parameters D1-D8) and a plurality of microLEDs defining a plurality of pixels (See FIG. 3, plurality of pixels 305, plurality of microLEDs 300, and FIG. 5 microLEDs 405a, 405b, 405c). Additionally, although four tiles 501, 502, 503, 504 are illustrated, it is to be understood that, in some embodiments, the plurality of tiles 505 can include more than four tiles. For example, in some embodiments, the plurality of tiles 505 can include 25 tiles to be assembled into a 5×5 array defining the display area 510, 36 tiles to be assembled into a 6×6 array defining the display area 510, 49 tiles to be assembled into a 7×7 array defining the display area 510, 64 tiles to be assembled into a 8×8 array defining the display area 510, 81 tiles to be assembled into a 9×9 array defining the display area 510, 100 tiles to be assembled into a 10×10 array defining the display area 510, or any other number of tiles to be assembled into a n×m array (See FIG. 1) without departing from the scope of the disclosure. In some embodiments, n can equal m (e.g., 5×5 array, 6×6 array, 7×7 array, etc.), and in some embodiments, n and m may be different (e.g., 5×6 array, 6×8 array, 7×10 array, etc.).

Turning back to FIG. 5, in some embodiments, a lateral distance 512 between at least one first outer pixel 521a of the first tile 501 spaced from a first edge 501a of the first tile 501 and at least one second outer pixel 522a of the second tile 502 spaced from a second edge 502a of the second tile 502 can define a registration pitch 512. Likewise, in some embodiments, a lateral distance 513 between at least one first outer pixel 521b of the first tile 501 spaced from a second edge 501b of the first tile 501 and at least one second outer pixel 523b of the third tile 503 spaced from a second edge 503b of the third tile 503 can define a registration pitch 513. In some embodiments, the registration pitch 512 can be defined based on a first lateral offset 531a of the at least one first outer pixel 521a from the first edge 501a of the first tile 501, a second lateral offset 532a of the at least one second outer pixel 522a from the second edge 502a of the second tile 502, and a space (e.g., gap 534) between the first edge 501a of the first tile 501 and the second edge 502a of the second tile 502. Likewise, in some embodiments, the registration pitch 513 can be defined based on a first lateral offset 531b of the at least one first outer pixel 521b from the second edge 501b of the first tile 501, a second lateral offset 533b of the at least one second outer pixel 523b from the second edge 503b of the third tile 503, and a space (e.g., gap 535) between the second edge 501b of the first tile 501 and the second edge 503b of the third tile 503. In some embodiments, the lateral offsets 531a, 532a, 531b, and 533b can be defined as respective distances from a center of respective outer pixels to a nearest location of the cut edge of the tile, selected so that the cut edge does not interfere with electronic operation of the respective outer pixels. Moreover, as additional tiles are assembled into the array, respective registration pitches can be defined between immediately adjacent outer pixels of immediately adjacent tiles of the additional tiles.

In some embodiments, the gap 534, 535 can be selected to prevent contact between immediately adjacent edges (edge 501a and edge 502a, edge 501b and edge 503b) of the tiles 501, 502, 503. In some embodiments, preventing contact between immediately adjacent edges of the tiles 501, 502, 503 can prevent chipping, cracking, breakage, and other damage of the immediately adjacent edges that may otherwise occur if the immediately adjacent edges were to contact. For example, in some embodiments, the gap 534, 535 can be from about 5 micrometers to about 200 micrometers, including all ranges and subranges therebetween. For example, in some embodiments, the gap 534, 535 can from about 5 micrometers to about 50 micrometers, from about 50 micrometers to about 100 micrometers, from about 100 micrometers to about 200 micrometers. Moreover, in some embodiments, the gap 534, 535 can vary along the respective immediately adjacent edges (edge 501a and edge 502a, edge 501b and edge 503b) of the tiles 501, 502, 503 based on deviation of at least one value of the predetermined parameters (e.g., first lateral dimension D1, second lateral dimension D2, squareness (D3-D4), D1 straightness (D5, D6), and D2 straightness (D7, D8)) from a corresponding value of the nominal tile 200 (See FIG. 2).

In some embodiments, the lateral offsets 531a, 532a, 531b, 533b can be provided on each tile 501, 502, 503 such that the at least one outer pixels 521a, 522a, 521b, 523b including the associated electronics (e.g., thin film transistors, wiring) and microLEDs are spaced a distance from the respective edges 501a, 502a, 501b, 503b of the tiles 501, 502, 503 to, for example, protect the microLEDs from electrical or mechanical damage that may otherwise occur if the at least one outer pixels 521a, 522a, 521b, 523b including the associated electronics and microLEDs were flush with the respective edges 501a, 502a, 501b, 503b of the tiles 501, 502, 503. In some embodiments, the lateral offsets 531a, 532a, 531b, 533b can be in a range from about 0.02 mm to about 0.6 mm, including all ranges and subranges therebetween. For example, in some embodiments, the lateral offsets 531a, 532a, 531b, 533b can be from about 0.02 mm to about 0.05 mm, from about 0.05 mm to about 0.1 mm, from about 0.1 mm to about 0.2 mm, from about 0.2 mm to about 0.3 mm, from about 0.3 mm to about 0.4 mm, from about 0.4 mm to about 0.5 mm, from about 0.5 mm to about 0.6 mm.

In some embodiments, defining a predetermined registration pitch with respect to all immediately adjacent tiles assembled into an array defining a display area of a display device can provide a criterion where, for example, registration pitches equal to or less than the predetermined registration pitch can be deemed acceptable, and registration pitches greater than the predetermined registration pitch can be deemed unacceptable. In some embodiments, acceptable registration pitches can correspond to a visually uniform, seamless display area, where boundaries of and between all immediately adjacent individual tiles assembled into the array are not visually discernable to a human eye viewing the plurality of pixels defining the display area. Alternatively, in some embodiments, unacceptable registration pitches can correspond to a display area where boundaries of and between one or more immediately adjacent individual tiles assembled into the array are visually discernable to the human eye viewing the plurality of pixels defining the display area.

For example, in some embodiments, an unacceptable array of a display area can be defined as an array including one or more immediately adjacent outer pixels of immediately adjacent tiles spaced a lateral distance greater than the predetermined registration pitch. Likewise, in some embodiments, an acceptable array of a display area can be defined as an array where all immediately adjacent outer pixels of immediately adjacent tiles spaced a lateral distance less than or equal to the predetermined registration pitch. In some embodiments, a failure (e.g., during a computer simulation simulating assembly of the tiles into an array) can be defined as a simulated occurrence of an unacceptable display area. Likewise, in some embodiments, a failure rate (e.g., during a computer simulation simulating assembly of the tiles into an array) can be defined as a ratio of a simulated occurrence of an unacceptable display area to a simulated occurrence of an acceptable display area. For example, in some embodiments, with respect to the computer simulation simulating assembly of the tiles into an array, a failure rate of 100% can correspond to a simulation where all simulated arrays included an unacceptable display area, and a failure rate of 0% can correspond to a simulation where all simulated arrays included an acceptable display area.

In some embodiments, the registration pitch 512, 513 can be less than or equal to about 1.5 times the pixel pitch (See FIG. 3, pixel pitch px, py). Additionally, in some embodiments, the registration pitch 512, 513 can be less than or equal to about 1.4 times the pixel pitch px, py, less than or equal to about 1.3 times the pixel pitch px, py, less than or equal to about 1.25 times the pixel pitch px, py, less than or equal to about 1.2 times the pixel pitch px, py, or less than or equal to about 1.1 times the pixel pitch px, py. Moreover, in some embodiments, the registration pitch 512, 513 can be less than or equal to about 1.01 times the pixel pitch px, py or less than or equal to the pixel pitch px, py. In some embodiments, the registration pitch 512 can be different than the registration pitch 513. Likewise, in some embodiments, the registration pitch 512 can be based on at least one of pixel pitch px and pixel pitch py, and the registration pitch 513 can be based on at least one of pixel pitch px and pixel pitch py. In some embodiments, registration pitch 512 can be based on at least one of pixel pitch px, py in the same or different proportion relative to registration pitch 513. In some embodiments, the registration pitch 512, 513 can be selected based on one or more additional factors including, but not limited to, an application in which the display area is to be employed. In some embodiments, defining the registration pitch 512, 513 based on the pixel pitch px, py can provide a corresponding display area that appears to the human eye as a uniform, seamless array of pixels providing a high-quality, visually appealing display to be employed in one or more display devices in accordance with embodiments of the disclosure.

Figure 6:
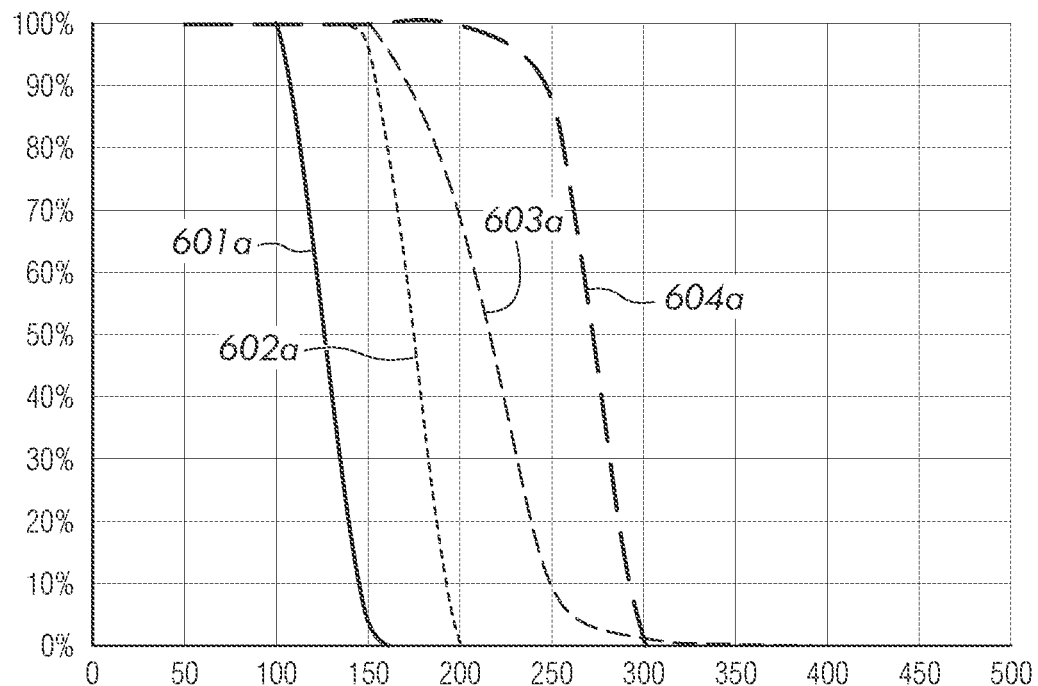
FIG. 6 illustrates an exemplary plot based on a simulated assembly of display areas including a plurality of 50 micrometer offset tiles for different tile cutting techniques in accordance with embodiments of the disclosure, where the vertical or "Y" axis represents failure rate in percentage (%) and the horizontal or "X" axis represents pixel pitch in micrometers (Iam)
Figure 7:
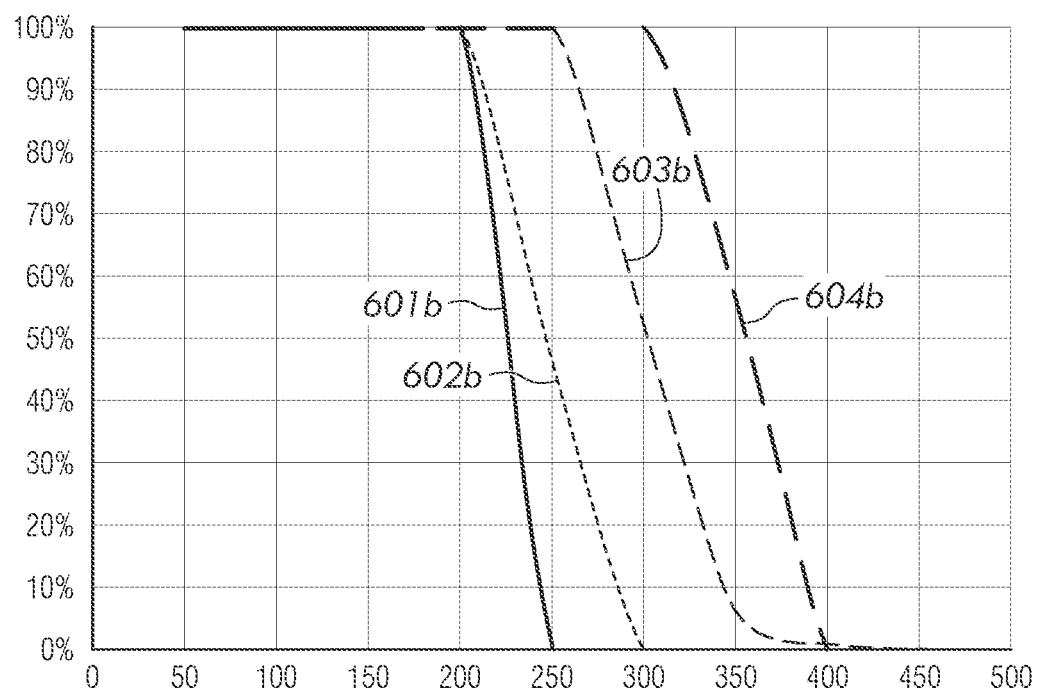
FIG. 7 illustrates an exemplary plot based on a simulated assembly of display areas including a plurality of 100 micrometer offset tiles for different tile cutting techniques in accordance with embodiments of the disclosure, where the vertical or "Y" axis represents failure rate in percentage (%) and the horizontal or "X" axis represents pixel pitch in micrometers (μm)

With respect to FIG. 6, FIG. 7, TABLE 44, and TABLE 45, an exemplary computer simulation was employed to compare differences among Cutting Techniques 1-4. In particular, the computer simulation simulated the assembly of the statistically large number of tiles, including the randomly generated values of predetermined parameters D1-D8, into multiple arrays defining multiple respective display arrays. In the computer simulation, a relative position method was employed with a failure criterion defined with respect to registration pitches greater than 1.1 times the corresponding pixel pitch px, py.

FIG. 6 illustrates an exemplary plot based on a simulated assembly of display areas including a plurality of tiles with a lateral offset of 50 micrometers for each Cutting Technique 1-4 in accordance with embodiments of the disclosure, where the vertical or "Y" axis represents failure rate in percentage (%) and the horizontal or "X" axis represents pixel pitch in micrometers (μm). Additionally, TABLE 44 provides the data on which the plot shown in FIG. 6 is based for each Cutting Technique 1-4 relative to the defined failure criterion for pixel pitches ranging from 50 micrometers to 500 micrometers, where line 601a represents the associated failure rate of Cutting Technique 1, line 602a represents the associated failure rate of Cutting Technique 2, line 603a represents the associated failure rate of Cutting Technique 3, and line 604a represents the associated failure rate of Cutting Technique 4.

TABLE 44

Display Area Array Assembly Simulation-50 um Lateral Offset

| Pixel Pitch [um] | Cutting Technique 1 601a | Cutting Technique 2 602a | Cutting Technique 3 603a | Cutting Technique 4 604a |
|---|---|---|---|---|
| 50 | 1.000 | 1.000 | 1.000 | 1.000 |
| 100 | 1.000 | 1.000 | 1.000 | 1.000 |
| 150 | 0.035 | 0.960 | 1.000 | 1.000 |
| 200 | 0.000 | 0.000 | 0.691 | 1.000 |
| 250 | 0.000 | 0.000 | 0.092 | 0.876 |
| 300 | 0.000 | 0.000 | 0.012 | 0.005 |
| 350 | 0.000 | 0.000 | 0.002 | 0.000 |
| 400 | 0.000 | 0.000 | 0.000 | 0.000 |
| 450 | 0.000 | 0.000 | 0.000 | 0.000 |
| 500 | 0.000 | 0.000 | 0.000 | 0.000 |

As can be seen from FIG. 6 and TABLE 44, based on the computer simulation, in some embodiments, a failure rate of about 10% or less can be achieved for display areas including a plurality of arrayed tiles with a pixel pitch of about 150 micrometers or greater by employing Cutting Technique 1. Likewise, a failure rate of about 10% or less can be achieved for display areas including a plurality of arrayed tiles with a pixel pitch of about 200 micrometers or greater by employing Cutting Technique 2, a failure rate of about 10% or less can be achieved for display areas including a plurality of arrayed tiles with a pixel pitch of about 250 micrometers or greater by employing Cutting Technique 3, and a failure rate of about 10% or less can be achieved for display areas including a plurality of arrayed tiles with a pixel pitch of about 300 micrometers or greater by employing Cutting Technique 4.

FIG. 7 illustrates an exemplary plot based on a simulated assembly of display areas including a plurality of tiles with a lateral offset of 100 micrometers for each Cutting Technique 1-4 in accordance with embodiments of the disclosure, where the vertical or "Y" axis represents failure rate in percentage (%) and the horizontal or "X" axis represents pixel pitch in micrometers (μm). Additionally, TABLE 45 provides the data on which the plot shown in FIG. 7 is based for each Cutting Technique 1-4 relative to the defined failure criterion for pixel pitches ranging from 50 micrometers to 500 micrometers, where line 601b represents the associated failure rate of Cutting Technique 1, line 602b represents the associated failure rate of Cutting Technique 2, line 603b represents the associated failure rate of Cutting Technique 3, and line 604b represents the associated failure rate of Cutting Technique 4.

TABLE 45

Display Area Array Assembly Simulation-100 um Lateral Offset

| Pixel Pitch [um] | Cutting Technique 1 601b | Cutting Technique 2 602b | Cutting Technique 3 603b | Cutting Technique 4 604b |
|---|---|---|---|---|
| 50 | 1.000 | 1.000 | 1.000 | 1.000 |
| 100 | 1.000 | 1.000 | 1.000 | 1.000 |
| 150 | 1.000 | 1.000 | 1.000 | 1.000 |
| 200 | 1.000 | 1.000 | 1.000 | 1.000 |
| 250 | 0.001 | 0.459 | 1.000 | 1.000 |
| 300 | 0.000 | 0.000 | 0.513 | 1.000 |
| 350 | 0.000 | 0.000 | 0.062 | 0.556 |
| 400 | 0.000 | 0.000 | 0.009 | 0.001 |
| 450 | 0.000 | 0.000 | 0.002 | 0.000 |
| 500 | 0.000 | 0.000 | 0.000 | 0.000 |

As can be seen from FIG. 7 and TABLE 45, based on the computer simulation, in some embodiments, a failure rate of about 10% or less can be achieved for display areas including a plurality of arrayed tiles with a pixel pitch of about 250 micrometers or greater by employing Cutting Technique 1. Likewise, a failure rate of about 10% or less can be achieved for display areas including a plurality of arrayed tiles with a pixel pitch of about 300 micrometers or greater by employing Cutting Technique 2, a failure rate of about 10% or less can be achieved for display areas including a plurality of arrayed tiles with a pixel pitch of about 350 micrometers or greater by employing Cutting Technique 3, and a failure rate of about 10% or less can be achieved for display areas including a plurality of arrayed tiles with a pixel pitch of about 400 micrometers or greater by employing Cutting Technique 4.

Accordingly, based on the results of the computer simulation shown in FIG. 6 and FIG. 7, one may select a particular cutting technique (e.g., Cutting Technique 1-4) to cut the plurality of tiles based on an acceptable failure rate and a predetermined pixel pitch. In some embodiments, a respective cost of the cutting technique can be considered and factored into selection of the cutting technique to be employed. For example, in some embodiments, Cutting Technique 1 can be selected to cut tiles to be employed in high-quality display areas (e.g., mobile displays, television displays); whereas, Cutting Technique 4 can be selected to cut tiles to be employed in relatively lower quality display areas (e.g., outdoor signage). In some embodiments, Cutting Technique 1 can be relatively more expensive and/or time consuming to employ than, for example, Cutting Technique 4. Thus, considerable advantages can be obtained by selecting one of Cutting Techniques 1-4 based on the information obtained from the computer simulations provided in FIG. 6 and FIG. 7.

Moreover, as described with respect to FIGS. 8-11 and TABLES 46-57, further computer simulations were employed based on randomly generated values of predetermined parameters D1-D8 for a statistically large number of tiles corresponding to Cutting Technique 3 with a predetermined pixel pitch (px, py) of 372 micrometers for lateral offsets (See FIG. 5, lateral offsets 531a, 532a, 531b, 533b) of 50 micrometers and 100 micrometers, where px equals py. Each of the simulated tiles, including the randomly generated values of predetermined parameters D1-D8, was assembled into a plurality of (n×m) arrays employing a global positioning method and a relative positioning method. Additionally, registration pitches of 1.5 times the pixel pitch, 1.1 times the pixel pitch, and 1.01 times the pixel pitch were simulated. For each simulated scenario, the simulation was repeated 1,000,000 times to provide a statistical sample from which representative trends and conclusions can be formed. Moreover, it is to be understood that the observed trends based on the computer simulations of Cutting Technique 3 (FIGS. 8-11 and TABLES 46-57) can provide equally relevant conclusions with respect to Cutting Technique 1, Cutting Technique 2, and Cutting Technique 4 in consideration of the comparative data provided in FIG. 6, FIG. 7, TABLE 44, and TABLE 45.

Additionally, three different tiling strategies were simulated and the respective failure rates of the display areas were recorded. A first tiling strategy can include randomly selecting each tile to be assembled into the arrays. For example, in some embodiments, with respect to the first tiling strategy, the computer simulation randomly selected each tile, including the randomly generated values of predetermined parameters D1-D8, without consideration of the randomly generated values of predetermined parameters D1-D8, and assembled the tile into the various arrays in accordance with embodiments of the disclosure.

TABLE 46 provides failure rates of the computer simulations employing the first tiling strategy with respect to 50 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 46

50 Micrometer Lateral Offset-Tiling Strategy 1

| Array | Global Position Method Registration Pitch × Pixel Pitch | | |
|---|---|---|---|
| | 1.5× — | 1.1× 701a | 1.01× 701b |
| 5 × 5 | 0.000004 | 0.000265 | 0.000647 |
| 6 × 6 | 0.000011 | 0.000397 | 0.001060 |
| 7 × 7 | 0.000013 | 0.000567 | 0.001486 |
| 8 × 8 | 0.000020 | 0.000919 | 0.002463 |
| 9 × 9 | 0.000037 | 0.001452 | 0.003805 |
| 10 × 10 | 0.000059 | 0.002245 | 0.005908 |

Figure 8:
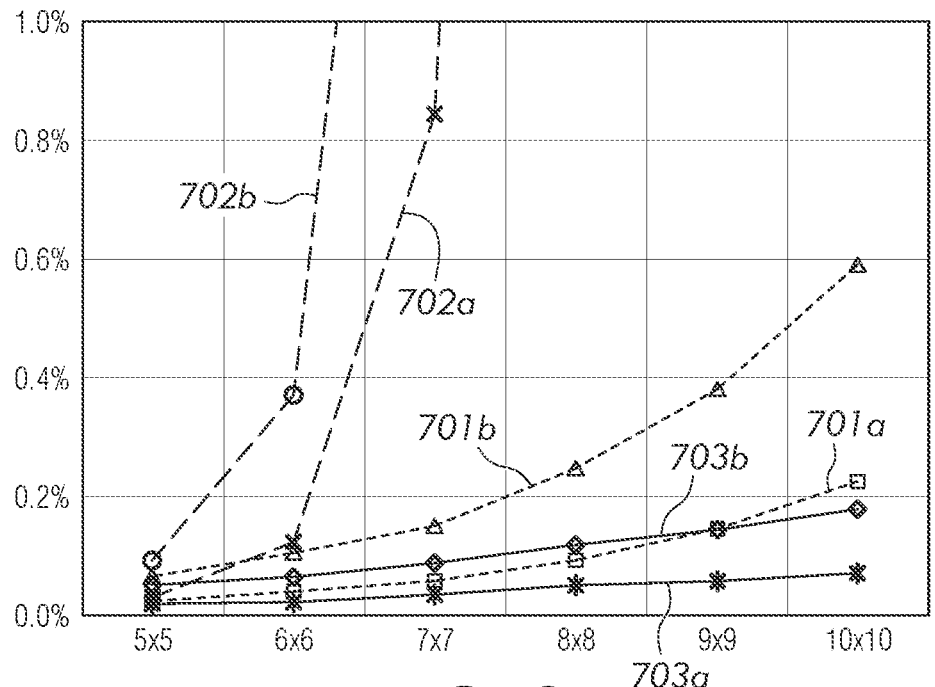
FIG. 8 illustrates an exemplary plot based on a simulated assembly of display areas including a plurality of 50 micrometer offset tiles with global positioning tolerance for different registration pitches and positioning strategies in accordance with embodiments of the disclosure, where the vertical or "Y" axis represents failure rate in percentage (%) and the horizontal or "X" axis represents display area size in number of tiles in an array (n×m)

Additionally, FIG. 8 illustrates an exemplary plot based on the simulated assembly of the first tiling strategy of TABLE 46, where the vertical or "Y" axis represents failure rate in percentage (%) and the horizontal or "X" axis represents display area size in number of tiles in an array (n×m). In particular, line 701a represents the respective failure rates for the various arrays with respect to a registration pitch of 1.1 times the pixel pitch for the 50 micrometer offset tiles assembled with the global positioning method employing the first tiling strategy, and line 701b represents the respective failure rates for the various arrays with respect to a registration pitch of 1.01 times the pixel pitch for the 50 micrometer offset tiles assembled with the global positioning method employing the first tiling strategy.

TABLE 47 provides failure rates of the computer simulations employing the first tiling strategy with respect to 50 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 47

50 Micrometer Pixel Offset-Tiling Strategy 1

| Array | Relative Position Method Registration Pitch × Pixel Pitch | | |
|---|---|---|---|
| | 1.5× — | 1.1× 701c | 1.01× 701d |
| 5 × 5 | 0.000006 | 0.000241 | 0.000612 |
| 6 × 6 | 0.000006 | 0.000316 | 0.000967 |
| 7 × 7 | 0.000013 | 0.000514 | 0.001302 |
| 8 × 8 | 0.000023 | 0.000668 | 0.001728 |
| 9 × 9 | 0.000023 | 0.000857 | 0.002224 |
| 10 × 10 | 0.000039 | 0.001036 | 0.002730 |

Figure 9:
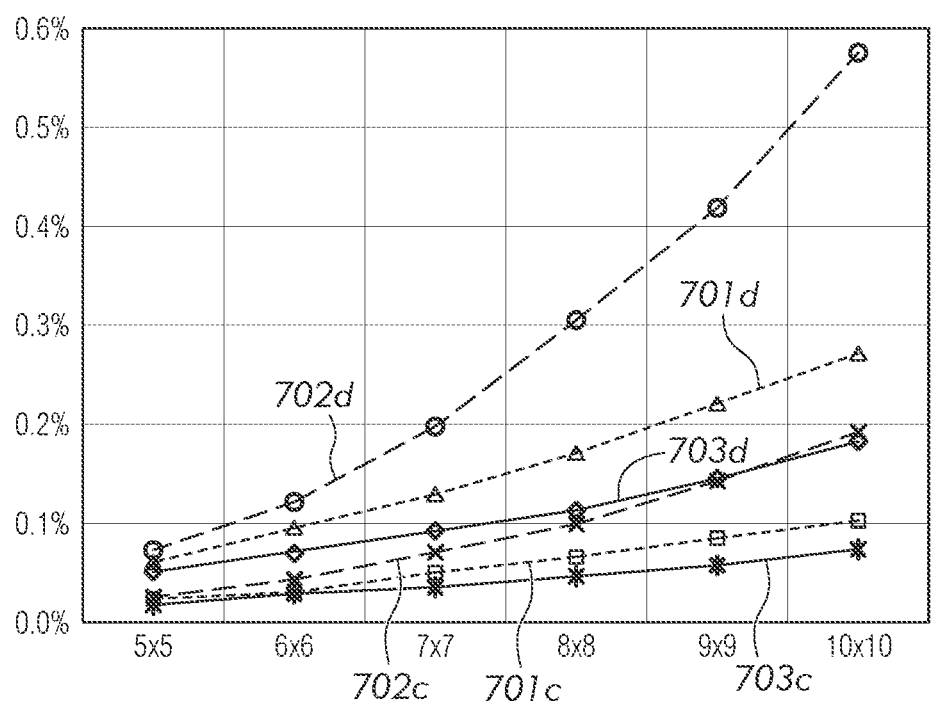
FIG. 9 illustrates an exemplary plot based on a simulated assembly of display areas including a plurality of 50 micrometer offset tiles with relative positioning tolerance for different registration pitches and positioning strategies in accordance with embodiments of the disclosure, where the vertical or "Y" axis represents failure rate in percentage (%) and the horizontal or "X" axis represents display area size in number of tiles in an array (n×m)

Additionally, FIG. 9 illustrates an exemplary plot based on the simulated assembly of the first tiling strategy of TABLE 47, where the vertical or "Y" axis represents failure rate in percentage (%) and the horizontal or "X" axis represents display area size in number of tiles in an array (n×m). In particular, line 701c represents the respective failure rates for the various arrays with respect to a registration pitch of 1.1 times the pixel pitch for the 50 micrometer offset tiles assembled with the relative positioning method employing the first tiling strategy, and line 701d represents the respective failure rates for the various arrays with respect to a registration pitch of 1.01 times the pixel pitch for the 50 micrometer offset tiles assembled with the relative positioning method employing the first tiling strategy.

TABLE 48 provides failure rates of the computer simulations employing the first tiling strategy with respect to 100 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 48

100 Micrometer Lateral Offset-Tiling Strategy 1

| Array | Global Position Method Registration Pitch × Pixel Pitch | | |
|---|---|---|---|
| | 1.5× — | 1.1× 704a | 1.01× 704b |
| 5 × 5 | 0.000061 | 0.005539 | 0.020601 |
| 6 × 6 | 0.000101 | 0.008658 | 0.031354 |
| 7 × 7 | 0.000149 | 0.011776 | 0.042760 |
| 8 × 8 | 0.000190 | 0.015921 | 0.057151 |
| 9 × 9 | 0.000249 | 0.020496 | 0.072925 |
| 10 × 10 | 0.000292 | 0.025801 | 0.091573 |

Figure 10:
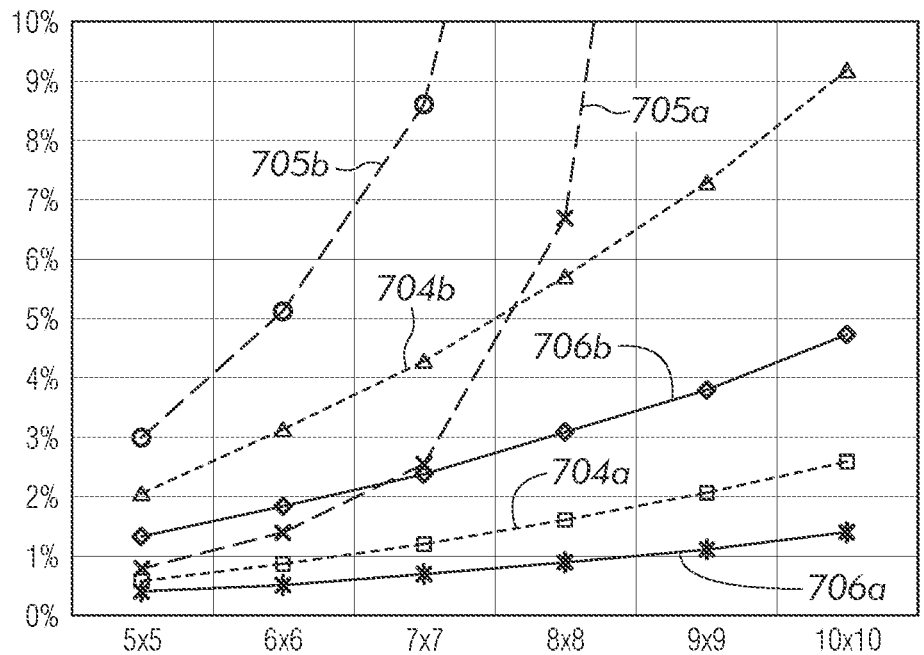
FIG. 10 illustrates an exemplary plot based on a simulated assembly of display areas including a plurality of 100 micrometer offset tiles with global positioning tolerance for different registration pitches and positioning strategies in accordance with embodiments of the disclosure, where the vertical or "Y" axis represents failure rate in percentage (%) and the horizontal or "X" axis represents display area size in number of tiles in an array (n×m)

Additionally, FIG. 10 illustrates an exemplary plot based on the simulated assembly of the first tiling strategy of TABLE 48, where the vertical or "Y" axis represents failure rate in percentage (%) and the horizontal or "X" axis represents display area size in number of tiles in an array (n×m). In particular, line 704a represents the respective failure rates for the various arrays with respect to a registration pitch of 1.1 times the pixel pitch for the 100 micrometer offset tiles assembled with the global positioning method employing the first tiling strategy, and line 704*b* represents the respective failure rates for the various arrays with respect to a registration pitch of 1.01 times the pixel pitch for the 100 micrometer offset tiles assembled with the global positioning method employing the first tiling strategy.

TABLE 49 provides failure rates of the computer simulations employing the first tiling strategy with respect to 100 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 49

100 Micrometer Lateral Offset-Tiling Strategy 1

| | Relative Position Method Registration Pitch × Pixel Pitch | | |
|---|---|---|---|
| Array | 1.5× — | 1.1× 704c | 1.01× 704d |
| 5 × 5 | 0.000060 | 0.005630 | 0.020532 |
| 6 × 6 | 0.000106 | 0.008385 | 0.030667 |
| 7 × 7 | 0.000135 | 0.011832 | 0.042709 |
| 8 × 8 | 0.000166 | 0.015566 | 0.056647 |
| 9 × 9 | 0.000243 | 0.020022 | 0.071737 |
| 10 × 10 | 0.000298 | 0.025327 | 0.090438 |

Figure 11:
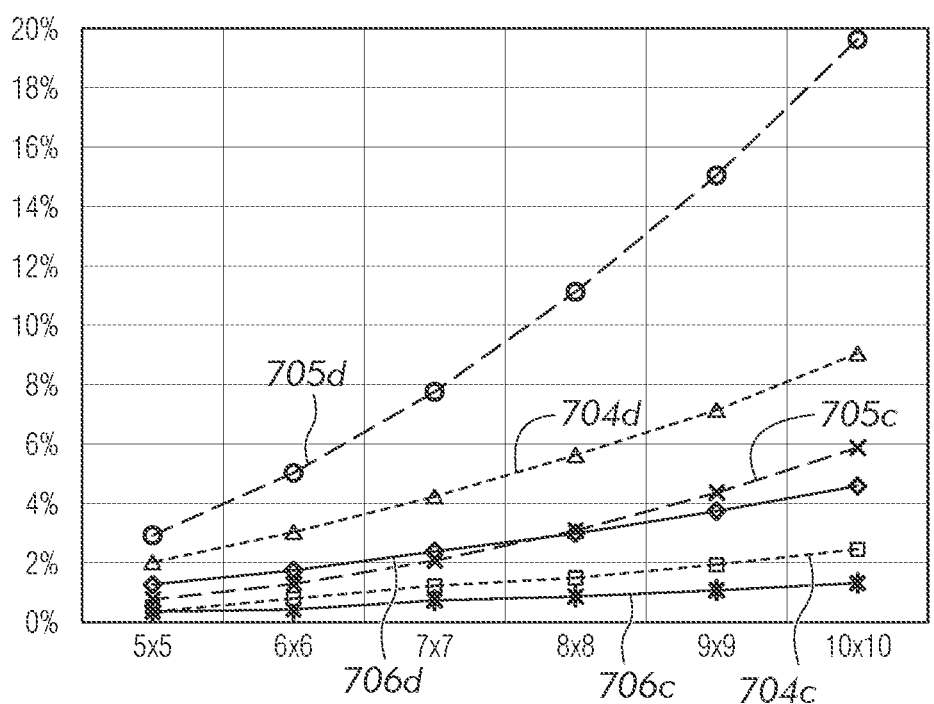
FIG. 11 illustrates an exemplary plot based on a simulated assembly of display areas including a plurality of 100 micrometer offset tiles with relative positioning tolerance for different registration pitches and positioning strategies in accordance with embodiments of the disclosure, where the vertical or "Y" axis represents failure rate in percentage (%) and the horizontal or "X" axis represents display area size in number of tiles in an array (n×m).

Additionally, FIG. 11 illustrates an exemplary plot based on the simulated assembly of the first tiling strategy of TABLE 49, where the vertical or "Y" axis represents failure rate in percentage (%) and the horizontal or "X" axis represents display area size in number of tiles in an array (n×m). In particular, line 704*c* represents the respective failure rates for the various arrays with respect to a registration pitch of 1.1 times the pixel pitch for the 100 micrometer offset tiles assembled with the relative positioning method employing the first tiling strategy, and line 704*d* represents the respective failure rates for the various arrays with respect to a registration pitch of 1.01 times the pixel pitch for the 100 micrometer offset tiles assembled with the relative positioning method employing the first tiling strategy.

A second tiling strategy can include selecting specific tiles to be assembled into an outer perimeter of the arrays and selecting other tiles to be assembled into an inner portion of the arrays. For example, in some embodiments, with respect to the second tiling strategy, the computer simulation selected a plurality of tiles with randomly generated values of predetermined parameters D1-D8 defining a first deviation relative to the respective nominal values and positioning those tiles around the outer perimeter of the various arrays in accordance with embodiments of the disclosure. Additionally, in some embodiments, with respect to the second tiling strategy, the computer simulation selected a plurality of tiles with randomly generated values of predetermined parameters D1-D8 defining a second deviation relative to the respective nominal values and positioning those tiles in the inner portion of the various arrays in accordance with embodiments of the disclosure. In some embodiments, the first deviation of the outer tiles was greater than the second deviation of the inner tiles.

TABLE 50 provides failure rates of the computer simulations employing the second tiling strategy with respect to 50 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 50

50 Micrometer Lateral Offset-Tiling Strategy 2

| | Global Position Method Registration Pitch × Pixel Pitch | | |
|---|---|---|---|
| Array | 1.5× — | 1.1× 702a | 1.01× 702b |
| 5 × 5 | 0.000002 | 0.000318 | 0.000910 |
| 6 × 6 | 0.000022 | 0.001226 | 0.003713 |
| 7 × 7 | 0.000109 | 0.008459 | 0.024156 |
| 8 × 8 | 0.000601 | 0.051992 | 0.123760 |
| 9 × 9 | 0.004356 | 0.214476 | 0.388026 |
| 10 × 10 | 0.027814 | 0.529003 | 0.730551 |

Additionally, FIG. 8 illustrates an exemplary plot based on the simulated assembly of the second tiling strategy of TABLE 50. In particular, line 702*a* represents the respective failure rates for the various arrays with respect to a registration pitch of 1.1 times the pixel pitch for the 50 micrometer offset tiles assembled with the global positioning method employing the second tiling strategy, and line 702*b* represents the respective failure rates for the various arrays with respect to a registration pitch of 1.01 times the pixel pitch for the 50 micrometer offset tiles assembled with the global positioning method employing the second tiling strategy.

TABLE 51 provides failure rates of the computer simulations employing the second tiling strategy with respect to 50 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 51

50 Micrometer Lateral Offset-Tiling Strategy 2

| | Relative Position Method Registration Pitch × Pixel Pitch | | |
|---|---|---|---|
| Array | 1.5× — | 1.1× 702c | 1.01× 702d |
| 5 × 5 | 0.000011 | 0.000256 | 0.000731 |
| 6 × 6 | 0.000009 | 0.000443 | 0.001230 |
| 7 × 7 | 0.000015 | 0.000718 | 0.001987 |
| 8 × 8 | 0.000014 | 0.001016 | 0.003065 |
| 9 × 9 | 0.000031 | 0.001451 | 0.004198 |
| 10 × 10 | 0.000042 | 0.001925 | 0.005782 |

Additionally, FIG. 9 illustrates an exemplary plot based on the simulated assembly of the second tiling strategy of TABLE 51. In particular, line 702*c* represents the respective failure rates for the various arrays with respect to a registration pitch of 1.1 times the pixel pitch for the 50 micrometer offset tiles assembled with the relative positioning method employing the second tiling strategy, and line 702*d* represents the respective failure rates for the various arrays with respect to a registration pitch of 1.01 times the pixel pitch for the 50 micrometer offset tiles assembled with the relative positioning method employing the second tiling strategy.

TABLE 52 provides failure rates of the computer simulations employing the second tiling strategy with respect to 100 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 52

100 Micrometer Lateral Offset-Tiling Strategy 2

Global Position Method
Registration Pitch × Pixel Pitch

| Array | 1.5× — | 1.1× 705a | 1.01× 705b |
|---|---|---|---|
| 5 × 5 | 0.000067 | 0.007784 | 0.029789 |
| 6 × 6 | 0.000122 | 0.013865 | 0.051185 |
| 7 × 7 | 0.000211 | 0.025224 | 0.085809 |
| 8 × 8 | 0.000689 | 0.066931 | 0.177813 |
| 9 × 9 | 0.004638 | 0.221722 | 0.414980 |
| 10 × 10 | 0.027967 | 0.531146 | 0.737177 |

Additionally, FIG. 10 illustrates an exemplary plot based on the simulated assembly of the second tiling strategy of TABLE 52. In particular, line 705a represents the respective failure rates for the various arrays with respect to a registration pitch of 1.1 times the pixel pitch for the 100 micrometer offset tiles assembled with the global positioning method employing the second tiling strategy, and line 705b represents the respective failure rates for the various arrays with respect to a registration pitch of 1.01 times the pixel pitch for the 100 micrometer offset tiles assembled with the global positioning method employing the second tiling strategy.

TABLE 53 provides failure rates of the computer simulations employing the second tiling strategy with respect to 100 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 53

100 Micrometer Lateral Offset-Tiling Strategy 2

Relative Position Method
Registration Pitch × Pixel Pitch

| Array | 1.5× — | 1.1× 705c | 1.01× 705d |
|---|---|---|---|
| 5 × 5 | 0.000064 | 0.007814 | 0.029861 |
| 6 × 6 | 0.000113 | 0.013408 | 0.050801 |
| 7 × 7 | 0.000181 | 0.021537 | 0.077855 |
| 8 × 8 | 0.000245 | 0.031767 | 0.111510 |
| 9 × 9 | 0.000343 | 0.044165 | 0.150601 |
| 10 × 10 | 0.000490 | 0.059470 | 0.195972 |

Additionally, FIG. 11 illustrates an exemplary plot based on the simulated assembly of the second tiling strategy of TABLE 53. In particular, line 705c represents the respective failure rates for the various arrays with respect to a registration pitch of 1.1 times the pixel pitch for the 100 micrometer offset tiles assembled with the relative positioning method employing the second tiling strategy, and line 705d represents the respective failure rates for the various arrays with respect to a registration pitch of 1.01 times the pixel pitch for the 100 micrometer offset tiles assembled with the relative positioning method employing the second tiling strategy.

With respect to the second tiling strategy, it was hypothesized that failure rates of the display areas could be reduced by employing the second tiling strategy relative to the first tiling strategy. However, as provided in FIGS. 8-11, it can be seen that respective failure rates of the second tiling strategy (e.g., lines 702a, 702b, 702c, 702d, and lines 705a, 705b, 705c, 705d) increased relative to the first tiling strategy (e.g., lines 701a, 701b, 701c, 701d, and lines 704a, 704b, 704c, 704d). Therefore, in some embodiments, the second tiling strategy can produce higher failure rates than the first tiling strategy.

Turning back to FIG. 5, a third tiling strategy can include selecting a first tile 501 of the plurality of tiles 505 based on a value of the predetermined parameter D1-D8 of the first tile 501 and selecting a second tile 502 of the plurality of tiles 505 based on a value of the predetermined parameter D1-D8 of the second tile 502. In some embodiments, the method can include positioning the first tile 501 and the second tile 502 into an array 506 defining at least a portion of the display area 510. In some embodiments, a first edge 501a of the first tile 501 can face a second edge 502a of the second tile 502.

In some embodiments, the value of the predetermined parameter D1-D8 of the first tile 501 can be greater than a nominal value of the predetermined parameter D1-D8, and the value of the predetermined parameter D1-D8 of the second tile 502 can be less than the nominal value of the predetermined parameter D1-D8. In some embodiments, the value of the predetermined parameter D1-D8 of the first tile 501 can define a greatest value of the predetermined parameters D1-D8 of the plurality of tiles 505 relative to a nominal value of the predetermined parameter, D1-D8 and the value of the predetermined parameter D1-D8 of the second tile 502 can define a smallest value of the predetermined parameters D1-D8 of the plurality of tiles 505 relative to the nominal value of the predetermined parameter D1-D8.

For example, in some embodiments, by selecting the first tile 501 with a value of the predetermined parameter D1-D8 greater than a nominal value of the predetermined parameter D1-D8, and the second tile 502 with a value of the predetermined parameter D1-D8 less than the nominal value of the predetermined parameter D1-D8, the respective deviations of the first tile 501 and the second tile 502 relative to the nominal tile, can offset (e.g., cancel) each other. Accordingly, in some embodiments, it was hypothesized that by selecting the tiles based on a value of the predetermined parameters D1-D8, and assembling the tiles in a manner where deviations of the tiles relative to a nominal tile can cancel each other, that a reduction of failure rates of the corresponding displays would be obtained.

In some embodiments, the method can further include sorting the plurality of tiles 505 based on a respective value of the predetermined parameter D1-D8 of the plurality of tiles 505. In some embodiments, the sorting can include identifying a first set of tiles and a second set of tiles. Likewise, in some embodiments, the sorting can include identifying a plurality of sets of tiles (e.g., more than two sets of tiles) based on a respective value of the predetermined parameter D1-D8 of the plurality of tiles 505. In some embodiments, the respective value of the predetermined parameter D1-D8 of each tile of the first set of tiles can be greater than a nominal value of the predetermined parameter D1-D8, and the respective value of the predetermined parameter D1-D8 of each tile of the second set of tiles can be less than the nominal value of the predetermined parameter D1-D8. In some embodiments, the method can further include ordering the first set of tiles in ascending order or descending order based on the respective value of the predetermined parameter D1-D8 of each tile of the first set of tiles, and ordering the second set of tiles in ascending order or descending order based on the respective value of the predetermined parameter D1-D8 of each tile of the second set of tiles. In some embodiments, the first tile 501 can be selected from the first set of tiles and the second tile 502 can be selected from the second set of tiles.

In some embodiments, the value of the predetermined parameter D1-D8 of the first tile 501 can define a greatest value of the predetermined parameters D1-D8 of the first set of tiles relative to the nominal value of the predetermined parameter D1-D8, and the value of the predetermined parameter D1-D8 of the second tile 502 can define a smallest value of the predetermined parameters D1-D8 of the second set of tiles relative to the nominal value of the predetermined parameter D1-D8.

In some embodiments, the method can further include selecting at least one additional tile (e.g., third tile 503, fourth tile 504) of the plurality of tiles 505 based on a value of the predetermined parameter D1-D8 of the at least one additional tile 503, 504 and positioning the at least one additional tile 503, 504 into the array 506. For example, in some embodiments, the third tile 503 can be positioned into the array 506 with a second edge 503b of the third tile 503 facing a second edge 501b of the first tile 501. Likewise, as represented by arrow 525, in some embodiments, the fourth tile 504 can be positioned into the array 506 with a first edge 504a of the fourth tile 504 facing a first edge 503a of the third tile 503 and a second edge 504b of the fourth tile 504 facing a second edge 502b of the second tile 502. In some embodiments, the method can be repeated a plurality of times by selecting at least one additional tile of the plurality of tiles 505 based on a value of the predetermined parameter D1-D8 of the at least one additional tile and positioning the at least one additional tile into the array 506 until the display area 510 includes a predetermined number of tiles.

In addition or alternatively, in some embodiments, the method of assembling the display area 510 can include selecting a plurality of pairs of tiles based on a respective value of the predetermined parameter D1-D8 of each tile. In some embodiments, each pair of tiles can include a first tile and a second tile. For example, a first pair of tiles 515a can include first tile 501 and second tile 502, and a second pair of tiles 515b can include third tile 503 and fourth tile 504. In some embodiments, the respective value of the predetermined parameter D1-D8 of the first tile (e.g., tile 501, tile 503) of each pair 515a, 515b can be greater than the respective value of the predetermined parameter D1-D8 of the second tile (e.g. tile 502, tile 504) of each pair 515a, 515b. The method can further include positioning the plurality of pairs of tiles 515a, 515b into the array 506 defining at least a portion of the display area 510. In some embodiments, a respective first edge 501a, 503a of the first tile (e.g. tile 501, tile 503) of each pair 515a, 515b can face a respective second edge 502a, 504a of the second tile (e.g. tile 502, tile 504) of each pair 515a, 515b.

In some embodiments, the respective value of the predetermined parameter D1-D8 of the first tile (e.g. tile 501, tile 503) of each pair 515a, 515b can be greater than a nominal value of the predetermined parameter D1-D8, and the respective value of the predetermined parameter D1-D8 of the second tile (e.g. tile 502, tile 504) of each pair 515a, 515b can be less than the nominal value of the predetermined parameter D1-D8.

In some embodiments, the method can further include identifying a first set of tiles and a second set of tiles. The respective value of the predetermined parameter D1-D8 of each tile of the first set of tiles can be greater than a nominal value of the predetermined parameter D1-D8 and the respective value of the predetermined parameter D1-D8 of each tile of the second set of tiles can be less than the nominal value of the predetermined parameter D1-D8. In some embodiments, the first tile (e.g., tile 501, tile 503) of each pair of tiles 515a, 515b can be selected from the first set of tiles, and the second tile (e.g. tile 502, tile 504) of each pair of tiles 515a, 515b can be selected from the second set of tiles.

In some embodiments, the method can further include ordering the first set of tiles in ascending order or descending order based on the respective value of the predetermined parameter D1-D8 of each tile of the first set of tiles, and ordering the second set of tiles in ascending order or descending order based on the respective value of the predetermined parameter D1-D8 of each tile of the second set of tiles. The first tile (e.g., tile 501, tile 503) of each pair of tiles 515a, 515b can be sequentially selected from the first set of ordered tiles and the second tile (e.g., tile 502, tile 504) of each pair of tiles 515a, 515b can be sequentially selected from the second set of ordered tiles.

A computer simulation was performed by selecting the tiles according to the third tiling strategy based on the value of the predetermined parameter D2 in accordance with methods of the disclosure. For example, tiles were selected based on the respective value of the predetermined parameter D2 where deviations of the tiles relative to a nominal tile can cancel each other. Likewise, in some embodiments, one or more tiles can be selected based on a respective value of two or more predetermined parameters D1-D8 where deviations of the two or more predetermined parameters D1-D8 of the one or more tiles relative to a nominal tile can cancel each other.

TABLE 54 provides failure rates of the computer simulations employing the third tiling strategy with respect to 50 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 54

50 Micrometer Lateral Offset-Tiling Strategy 3

| | Global Position Method Registration Pitch × Pixel Pitch | | |
|---|---|---|---|
| Array | 1.5× | 1.1× 703a | 1.01× 703b |
| 5 × 5 | 0.000009 | 0.000207 | 0.000500 |
| 6 × 6 | 0.000007 | 0.000227 | 0.000628 |
| 7 × 7 | 0.000014 | 0.000358 | 0.000879 |
| 8 × 8 | 0.000017 | 0.000503 | 0.001179 |
| 9 × 9 | 0.000020 | 0.000581 | 0.001433 |
| 10 × 10 | 0.000026 | 0.000707 | 0.001791 |

Additionally, FIG. 8 illustrates an exemplary plot based on the simulated assembly of the third tiling strategy of TABLE 54. In particular, line 703a represents the respective failure rates for the various arrays with respect to a registration pitch of 1.1 times the pixel pitch for the 50 micrometer offset tiles assembled with the global positioning method employing the third tiling strategy, and line 703b represents the respective failure rates for the various arrays with respect to a registration pitch of 1.01 times the pixel pitch for the 50 micrometer offset tiles assembled with the global positioning method employing the third tiling strategy.

TABLE 55 provides failure rates of the computer simulations employing the third tiling strategy with respect to 50 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 55

50 Micrometer Lateral Offset-Tiling Strategy 3

| | Relative Position Method Registration Pitch × Pixel Pitch | | |
|---|---|---|---|
| Array | 1.5× — | 1.1× 703c | 1.01× 703d |
| 5 × 5 | 0.000008 | 0.000193 | 0.000524 |
| 6 × 6 | 0.000009 | 0.000304 | 0.000695 |
| 7 × 7 | 0.000010 | 0.000364 | 0.000930 |
| 8 × 8 | 0.000021 | 0.000472 | 0.001138 |
| 9 × 9 | 0.000020 | 0.000587 | 0.001467 |
| 10 × 10 | 0.000036 | 0.000750 | 0.001833 |

Additionally, FIG. 9 illustrates an exemplary plot based on the simulated assembly of the third tiling strategy of TABLE 55. In particular, line 703c represents the respective failure rates for the various arrays with respect to a registration pitch of 1.1 times the pixel pitch for the 50 micrometer offset tiles assembled with the relative positioning method employing the third tiling strategy, and line 703d represents the respective failure rates for the various arrays with respect to a registration pitch of 1.01 times the pixel pitch for the 50 micrometer offset tiles assembled with the relative positioning method employing the third tiling strategy.

TABLE 56 provides failure rates of the computer simulations employing the third tiling strategy with respect to 100 micrometer lateral offset tiles employing a global positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 56

100 Micrometer Lateral Offset-Tiling Strategy 3

| | Global Position Method Registration Pitch × Pixel Pitch | | |
|---|---|---|---|
| Array | 1.5× — | 1.1× 706a | 1.01× 706b |
| 5 × 5 | 0.000057 | 0.003823 | 0.013258 |
| 6 × 6 | 0.000093 | 0.005331 | 0.018352 |
| 7 × 7 | 0.000091 | 0.006995 | 0.024065 |
| 8 × 8 | 0.000133 | 0.008947 | 0.030818 |
| 9 × 9 | 0.000182 | 0.011025 | 0.038116 |
| 10 × 10 | 0.000204 | 0.013915 | 0.047256 |

Additionally, FIG. 10 illustrates an exemplary plot based on the simulated assembly of the third tiling strategy of TABLE 56. In particular, line 706a represents the respective failure rates for the various arrays with respect to a registration pitch of 1.1 times the pixel pitch for the 100 micrometer offset tiles assembled with the global positioning method employing the third tiling strategy, and line 706b represents the respective failure rates for the various arrays with respect to a registration pitch of 1.01 times the pixel pitch for the 100 micrometer offset tiles assembled with the global positioning method employing the third tiling strategy.

TABLE 57 provides failure rates of the computer simulations employing the third tiling strategy with respect to 100 micrometer lateral offset tiles employing a relative positioning method positioning tiles into 5×5 arrays, 6×6 arrays, 7×7 arrays, 8×8 arrays, 9×9 arrays, and 10×10 arrays with registration pitches of 1.5 times the pixel pitch, 1.1 times the pixel pitch, and 1.01 times the pixel pitch.

TABLE 57

100 Micrometer Lateral Offset-Tiling Strategy 3

| | Relative Position Method Registration Pitch × Pixel Pitch | | |
|---|---|---|---|
| Array | 1.5× — | 1.1× 706c | 1.01× 706d |
| 5 × 5 | 0.000046 | 0.003847 | 0.013260 |
| 6 × 6 | 0.000080 | 0.005216 | 0.017989 |
| 7 × 7 | 0.000093 | 0.007059 | 0.023898 |
| 8 × 8 | 0.000146 | 0.009260 | 0.030637 |
| 9 × 9 | 0.000174 | 0.011450 | 0.038313 |
| 10 × 10 | 0.000195 | 0.013820 | 0.046269 |

Additionally, FIG. 11 illustrates an exemplary plot based on the simulated assembly of the third tiling strategy of TABLE 57. In particular, line 706c represents the respective failure rates for the various arrays with respect to a registration pitch of 1.1 times the pixel pitch for the 100 micrometer offset tiles assembled with the relative positioning method employing the third tiling strategy, and line 706d represents the respective failure rates for the various arrays with respect to a registration pitch of 1.01 times the pixel pitch for the 100 micrometer offset tiles assembled with the relative positioning method employing the third tiling strategy.

With respect to the third tiling strategy, as noted, it was hypothesized that failure rates of the display areas could be reduced by employing the third tiling strategy relative to the first tiling strategy. Additionally, the third tiling strategy can be employed to position a plurality of tiles throughout the display area as well as to position a plurality of tiles in one or more predetermined regions (e.g., perimeter, corners, central region) of the display area. As provided in FIGS. 8-11, it can be seen that respective failure rates of the third tiling strategy (e.g., lines 703a, 703b, 703c, 703d, and lines 706a, 706b, 706c, 706d) decreased relative to the first tiling strategy (e.g., lines 701a, 701b, 701c, 701d, and lines 704a, 704b, 704c, 704d). Therefore, in some embodiments, the third tiling strategy can produce lower failure rates than the first tiling strategy. Accordingly, in some embodiments, assembling a display area including a plurality of tiles including a plurality of microLEDs defining a plurality of pixels in accordance with embodiments of the disclosure can provide several advantages with respect to reducing failure rates of the display area of a display device.

Moreover, in some embodiments, an exemplary variation of one or more of the first, second, or third tiling strategies can include modifying (e.g., truncating) the plurality of tiles by, for example, removing one or more tiles that are not within a predetermined standard deviation (e.g., 6-sigma, 3-sigma) of a numerical distribution of the values of the predetermined parameters D1-D8 from the plurality of tiles. Accordingly, in some embodiments, after removing the one or more tiles, tiles can be selected from the modified plurality of tiles in accordance with one or more of the first, second, or third tiling strategies without departing from the scope of the disclosure. Likewise, in some embodiments, selecting a tile based on a value of the predetermined parameters D1-D8 can be based on a single predetermined parameter or a combination of one or more predetermined parameters D1-D8.

It should be understood that while various embodiments have been described in detail with respect to certain illustrative and specific embodiments thereof, the present disclosure should not be considered limited to such, as numerous modifications and combinations of the disclosed features are possible without departing from the scope of the following claims.

The invention claimed is:

1. A display device, comprising:
    a first tile comprising a first major surface, a second major surface opposite the first major surface, and a first edge surface connecting the first major surface and the second major surface;
    a second tile comprising a third major surface, a fourth major surface opposite the third major surface, and a second edge surface connecting the third major surface and the fourth major surface, the second edge surface immediately adjacent the first edge surface, the first edge surface and the second edge surface separated by a gap in a range from 5 μm to 200 μm;
    a first plurality of light emitting diodes defining a first plurality of pixels disposed on the first major surface and arranged in a first array of rows and columns, the first plurality of pixels comprising a first pixel pitch along one of a row or a column of the first array of rows and columns;
    a second plurality of light emitting diodes defining a second plurality of pixels disposed on the third major surface and arranged in a second array of rows and columns, the second plurality of pixels comprising a second pixel pitch along one of a row or a column of the second array of rows and columns; and
    wherein a first outermost light emitting diode of the first plurality of light emitting diodes is spaced from the first edge surface by a first lateral offset, a second outermost light emitting diode of the second plurality of pixels immediately adjacent the first outermost light emitting diode is spaced from the second edge surface by a second lateral offset, and at least one of the first lateral offset or the second lateral offset is in a range from 0.02 mm to 0.60 mm.

2. The display device of claim 1, wherein the gap is in a range from 50 μm to 100 μm.

3. The display device of claim 1, wherein the gap is in a range from 5 μm to 50 μm.

4. The display device of claim 1, wherein each of the first pixel pitch and the second pixel pitch is in a range from 50 μm to 1000 μm.

5. The display device of claim 1, wherein each of the first pixel pitch and the second pixel pitch is in a range from 100 μm to 500 μm.

6. The display device of claim 1, wherein each of the first pixel pitch and the second pixel pitch is in a range from 100 μm to 300 μm.

7. The display device of claim 1, wherein a registration pitch defined as a lateral distance between the first outermost pixel and the second outermost pixel is less than or equal to about 1.5 times at least one of the first pixel pitch or the second pixel pitch.

8. The display device of claim 6, wherein the registration pitch is less than or equal to 1.1 times the at least one of the first pixel pitch or the second pixel pitch.

9. The display device of claim 1, wherein the first pixel pitch is equal to the second pixel pitch.

10. The display device of claim 1, wherein the display device comprises an LCD backlight unit.

11. The display device of claim 1, wherein at least one of the first plurality of light emitting diodes or the second plurality of light emitting diodes comprises light emitting diodes that emit white or blue light.

12. The display device of claim 11, wherein the light emitting diodes that emit white or blue light are provided with a color filter.

13. The display device of claim 1, wherein at least one of the first plurality of light emitting diodes or the second plurality of light emitting diodes comprises microLEDs.

14. The display device of claim 1, wherein at least one of the first tile or the second tile comprises a lateral dimension in a range from 10 mm to 1000 mm.

15. The display device of claim 1, wherein a dimension of a light emitting area of a light emitting diode of the first plurality of light emitting diodes is in a range from 10 μm to 200 μm.

* * * * *